(12) United States Patent
Sano et al.

(10) Patent No.: US 12,451,392 B2
(45) Date of Patent: Oct. 21, 2025

(54) METHODS FOR SEAM REPAIR AND SEMICONDUCTOR STRUCTURE MANUFACTURED THEREOF

(71) Applicant: TAIWAN SEMICONDUCTOR MANUFACTURING COMPANY, LTD., Hsinchu (TW)

(72) Inventors: Kenichi Sano, Hsinchu (TW); Chin-Hsiang Lin, Hsinchu (TW); Hsu-Kai Chang, Hsinchu (TW); Pinyen Lin, Rochester, NY (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 444 days.

(21) Appl. No.: 18/106,680

(22) Filed: Feb. 7, 2023

(65) Prior Publication Data

US 2024/0105500 A1    Mar. 28, 2024

Related U.S. Application Data

(60) Provisional application No. 63/410,353, filed on Sep. 27, 2022.

(51) Int. Cl.
*H01L 21/762*    (2006.01)
*H01L 21/768*    (2006.01)
(Continued)

(52) U.S. Cl.
CPC .. *H01L 21/76229* (2013.01); *H01L 21/76883* (2013.01); *H10D 84/0188* (2025.01); *H10D 84/038* (2025.01); *H10D 84/83* (2025.01)

(58) Field of Classification Search
CPC ........ H01L 21/28556; H01L 21/28562; H01L 21/76229; H01L 21/76837; H01L 21/76877; H01L 21/76883; H10D 30/01; H10D 30/014; H10D 30/019–0198; H10D 30/43; H10D 30/435; H10D 30/501–509; H10D 30/6735; H10D 30/674; H10D 30/6757; H10D 62/121; H10D 62/151; H10D 84/01; H10D 84/0188; H10D 84/038; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/851–852; H10D 84/856
See application file for complete search history.

(56) References Cited

U.S. PATENT DOCUMENTS 9,209,247 B2   12/2015  Colinge et al.
9,236,267 B2    1/2016  De et al.
(Continued)

*Primary Examiner* — Cheung Lee
(74) *Attorney, Agent, or Firm* — NZ Carr Law Office

(57) ABSTRACT

The present disclosure provides a method for repairing a seam within a conformally deposited material. One or more seam repairing precursor sources may be delivered to seams or voids using a carrier at a super critical fluid phase. At the super critical fluid phase, the carrier has liquid like density and gas like high diffusion capability, therefore capable of delivering the repairing precursor sources to seams or voids under surfaces of a structure. In some embodiments, carbon dioxide or argon may be used as a carrier.

20 Claims, 18 Drawing Sheets

A

(51) Int. Cl.
    *H10D 84/01*     (2025.01)
    *H10D 84/03*     (2025.01)
    *H10D 84/83*     (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2015/0348966 A1* | 12/2015 | Zhao ............... H10D 84/0135 438/283 |

* cited by examiner

METHODS FOR SEAM REPAIR AND SEMICONDUCTOR STRUCTURE MANUFACTURED THEREOF

CROSS-REFERENCE TO RELATED APPLICATIONS

This application claims priority to U.S. Provisional Application Ser. No. 63/410,353 filed Sep. 27, 2022, which is incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density, i.e., the number of interconnected devices per chip area, has generally increased while geometric size, i.e., the smallest component that can be created using a fabrication process, has decreased. Such advances have increased the complexity of manufacturing and processing ICs; similar developments in IC processing and manufacturing are being developed to meet this progress.

With continuous reduction of the geometric size, aspect ratios of trenches and vias during semiconductor fabrication have increased making it challenging to fill. Atomic layer deposition (ALD) process or the like is used to fill trenches and vias by conformal coatings of thin layers. However, conformal deposition process, such as ALD, may result in seams in the filled material. The seams may cause in film damage by subsequent dry etch and/or wet etching. Embodiments of the present disclosure relates to methods of forming seam-free films and the devices manufactured thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
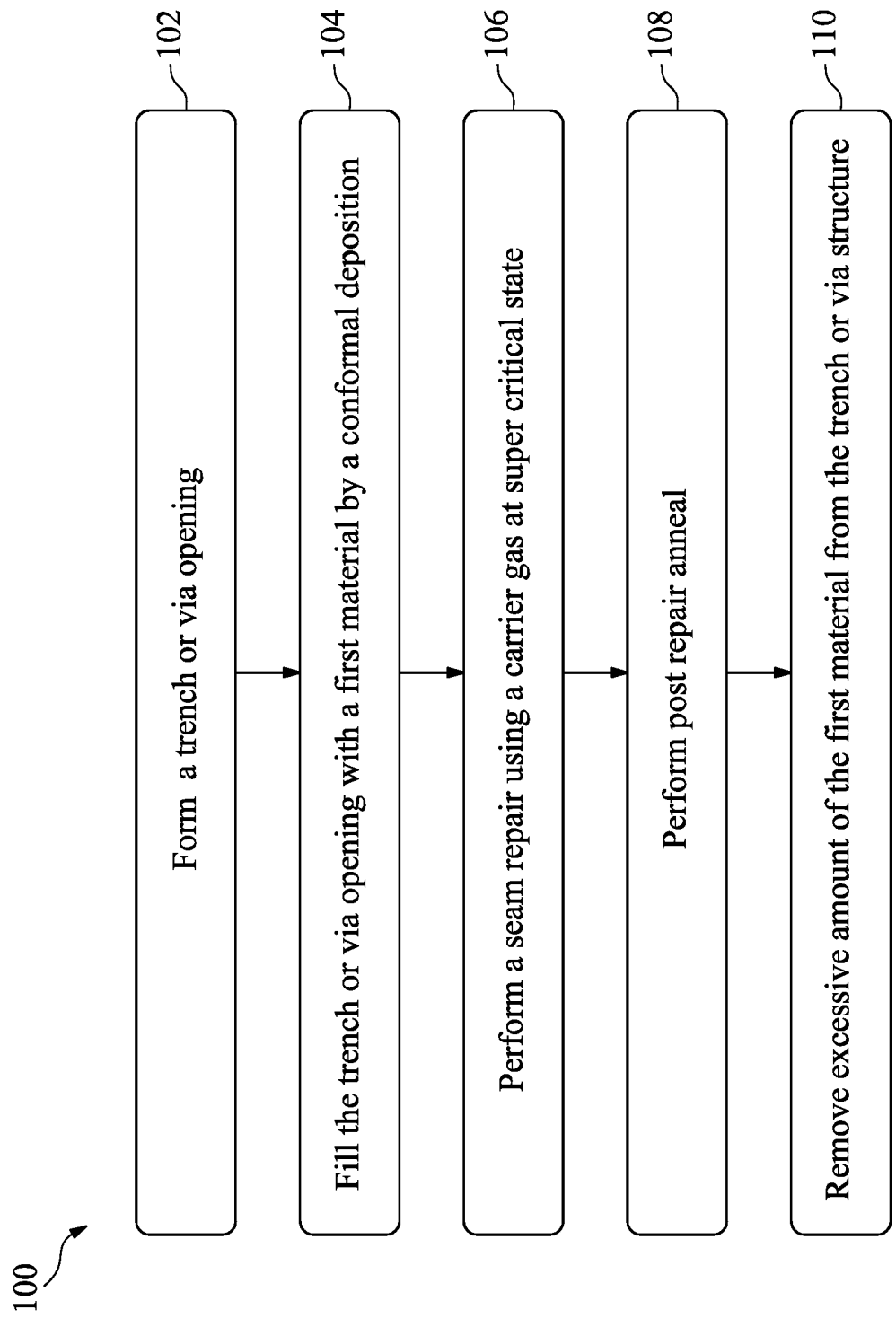
FIG. 1 is a flow chart of a method for repairing a seam in a trench or via structure according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor integrated circuit manufacturing processes, semiconductor devices are formed in or on a substrate. Various structures, such as dielectric walls, conductive lines and vias, may be fabricated by forming trenches and via openings in one or more layers, and filling the trenches and via openings using conformal deposition. However, conformal depositions sometimes result in seams or even voids in trench and via openings. In subsequent processing, such as etching back or planarization, the seams and voids may be exposed causing damage to the material layer. According to embodiments of the present disclosure, one or more seam repairing precursor sources may be delivered to the seams or voids using a carrier at a super critical phase. At super critical fluid phase, the carrier has liquid like density and gas like high diffusion capability, therefore capable of delivering the repairing precursor sources to seams or voids under surfaces of a structure. In some embodiments, carbon dioxide or argon may be used as a carrier.

FIG. 1 is a flow chart of a method 100 for repairing a seam in a trench or via structure according to embodiments of the present disclosure. FIGS. 2, 3, 3A, 4, 4A, 4B, 4C, and 5 schematically demonstrate a semiconductor structure 200 with repaired seams at various stages manufactured using the method 100.

Figure 2:
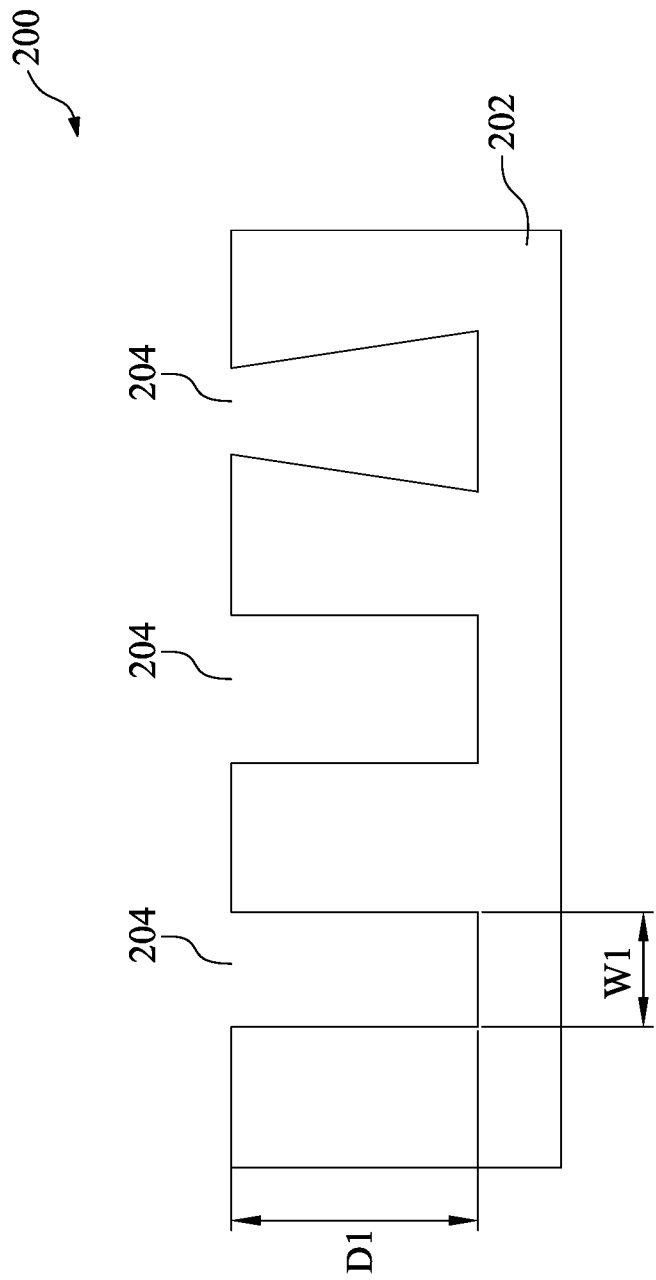
FIGS. 2, 3, 3A, 4, 4A, 4B, 4C, and 5 schematically demonstrate trench or structures with repaired seams at various stages in manufacturing according to embodiments of the present disclosure.

At operation 102, trench or via openings 204 may be formed in a material layer 202, as shown in FIG. 2. The material layer 202 may be a single material layer or multiple layers. For example, the material layer 202 may be one or more interlayer dielectric layers in which conductive features are formed by filling the trench or via openings 204. The material layer 202 may also be semiconductor materials, and dielectric materials may fill the trench or via openings 204 to form dielectric walls between the semiconductor material.

The trench or via openings 204 may be formed by one or more etching processes. Each trench or via opening 204 may have a width W1 and a depth D1. A ratio of the depth D1 over the width W1 is typically referred to as aspect ratio. As the width W1 gets smaller or the aspect ratio gets higher, it may be difficult to fill the trench or via openings fill the trench or via openings 204. FIG. 2 schematically illustrates the trench or via opening 204 of different widths and shapes. In some instances, the width W1 of the trench or via opening 204 may be substantially the uniform along the z-direction. In other instance, the trench or via opening 204 may be wider at the bottom and wider at the entrance as shown in FIG. 2. In other situations, the trench or via opening 204 may be wider at the entrance and narrower at the bottom.

It should be noted that the material layer 202 may be any suitable material and the trench or via openings 204 may be of any suitable dimension according to the design.

Figure 3:
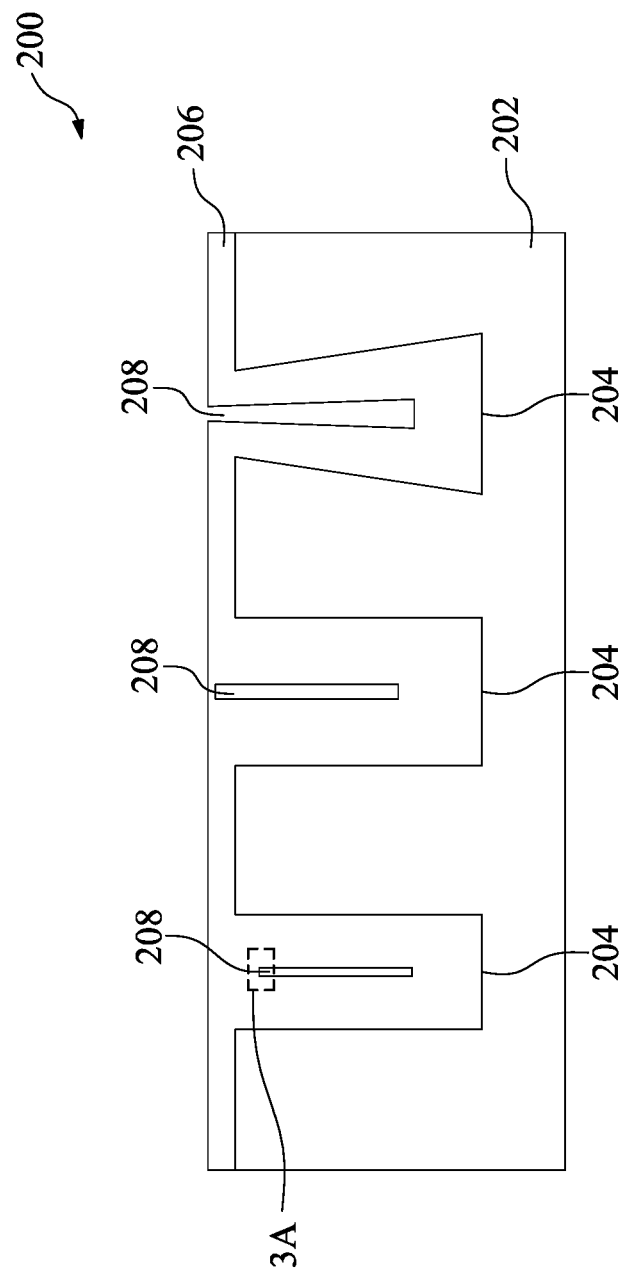

At operation 104, a filling material 206 is deposited in the trench or via openings 204 and over the material layer 202, as shown in FIG. 3. In some embodiments, the filling material 206 may be deposited using a conformal layer deposition, such as atomic layer deposition (ALD) to substantially fill the trench or via openings 204. Particularly, the filling material 206 is deposited on exposed surfaces monolayer by monolayer. As a result, the filling material 206 is uniformly deposited on the exposed surface. Depending on the dimension and shape of the trench or via opening 204, seams 208 may be formed within the trench or via openings 204 as surfaces of the monolayer meet when the trench or via openings 204 are substantially filled. The seams 208 may extend along the height of the trench or via openings 204 in the vertical direction. As shown in FIG. 3, the seams 208 may start at different vertical levels and of different lengths.

Figure 3A:
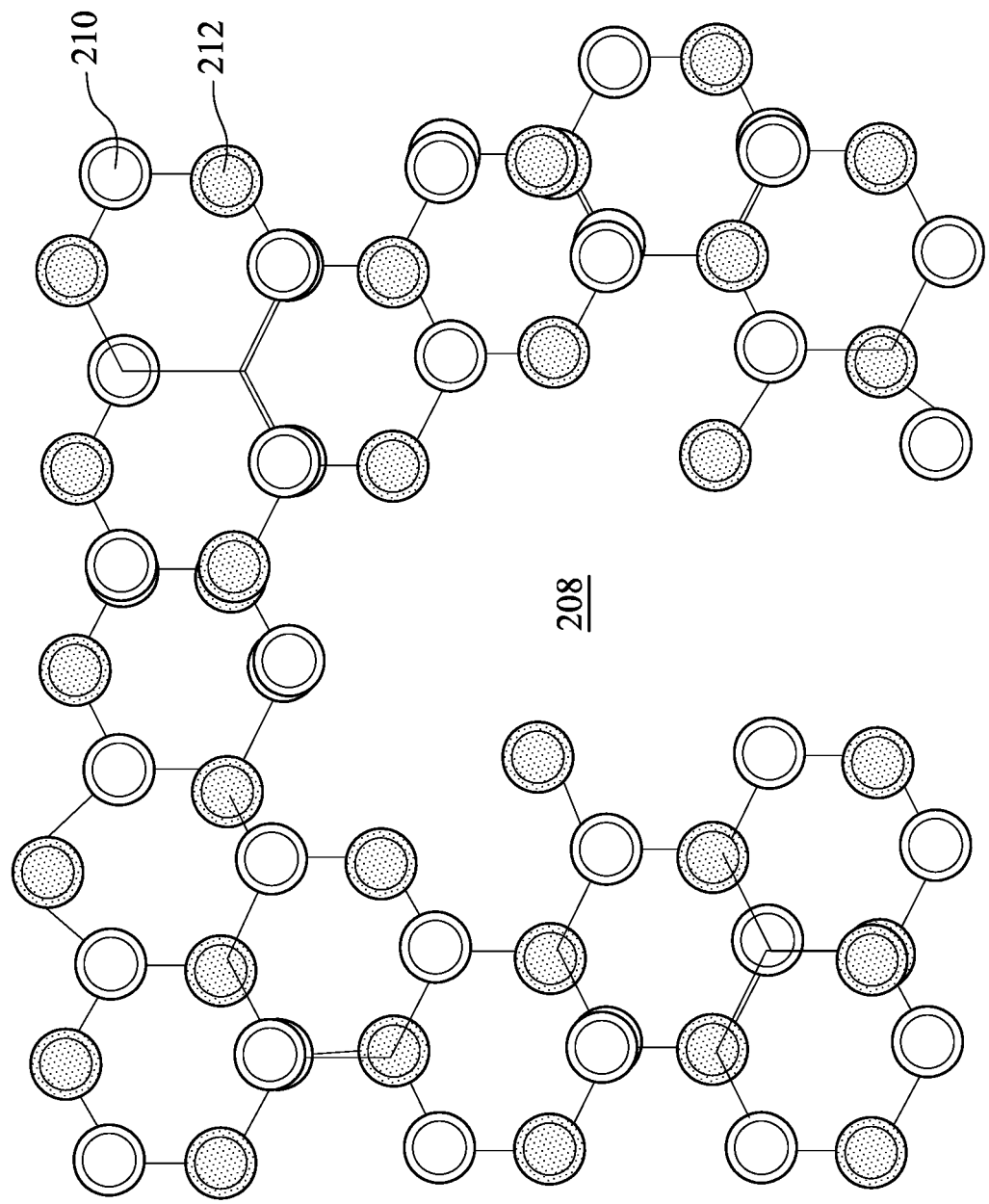

Within the seams 208, the crystalline structure of the filling material 206 is discontinuous, gapped, or otherwise imperfect. FIG. 3A is a schematic illustration of the crystalline structure of the filling material 206 near the seam 208, in area 3A marked in FIG. 3. In the example of FIG. 3A, the filling material 206 is a silicon nitride (SiN). There are gaps in the crystalline of the filling material 206 as shown in FIG. 3A. In the example of FIG. 3A, the filling material 206 is a compound of a first element 210 and a second element 212. The bulk portion of the filling material 206 includes a crystalline structure of the first element 210 and the second element 212. At the seam 208, the crystalline structure is interrupted and with dangling atoms of the first element 210 and the second element 212. The crystalline structure in FIG. 3A is a schematic. It should be noted that the crystalline structure would vary with variation of the first and second elements 210, 212.

The filling material 206 may be any suitable material, and may include less or more elements, for example a single element material, or a compound with more than two elements. In some embodiments, the filling material 206 may be $Si_3N_4$, SiCN, SiCO, $SiO_2$, Co, Mo, W, TiN, or other materials.

Figure 4:
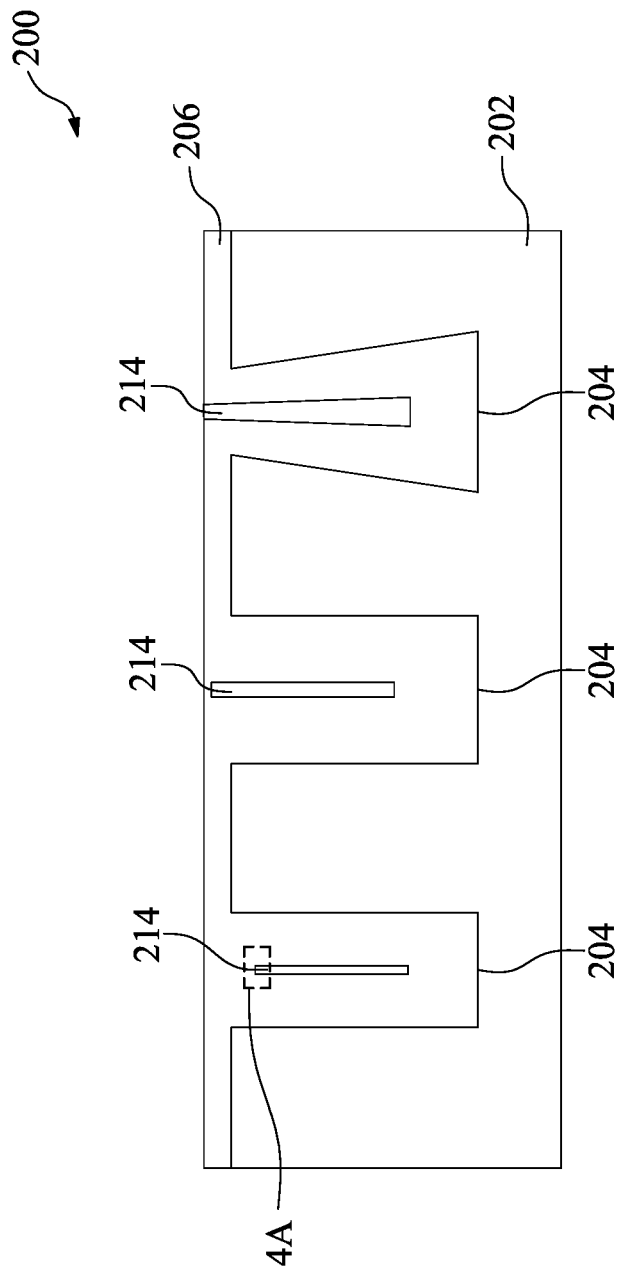

In operation 106, a repairing treatment is performed to the filling material 206 using a carrier at the super critical fluid phase. In some embodiments, a patch layer 214 is formed in the seam 208, as shown in FIG. 4. The super critical fluid phase is sometimes referred to as the fourth phase state besides the familiar solid, liquid, and gas phase states of a material, and is commonly called super critical fluid. At the super critical fluid phase, a material is at liquid and gas phases at the same time. FIG. 4 is a temperature-pressure graph. FIG. 4 illustrates an exemplary phase chart of a material. The temperature-pressure graph is divided into a solid phase region 602, a liquid phase region 604, a gas phase region 606, and a super critical phase region 608. Depending on the temperature and pressure of a material, the material may be solid, liquid, gas, and super critical fluid phase. Point 601 denotes a temperature and with a pressure commonly referred to as a critical point. The temperature value at the critical point may be referred to as the critical temperature. The pressure value at the critical point may be referred to as the critical pressure. For example, for carbon dioxide, the critical temperature is about 31.1° C. and the critical pressure is about 72.8 atm. The material is at the super critical fluid phase when the temperature is above the temperature of the critical point and the pressure is above the pressure at the critical point. At the super critical fluid phase, the material has relatively high permeability as in a gas phase and the relatively high density as in a liquid phase. The super critical fluid phase also has properties of high activity and high reactivity in comparison with the liquid or gas phases of the particular material. The super critical fluid phase also has properties close to those of an ideal gas because the super critical fluid can move fast in uniform even when mixed with other materials. Further, since the interaction between fluid molecules of a source precursor in the super critical fluid state is small, the reactivity of the source precursor is greatly increased, thereby shortening processing time. Further, because unreacted material can be easily recollected just by effecting a slight change of a temperature and/or a pressure, use of such a super critical fluid is very economical, efficient, and environmentally advantageous.

In some embodiments, the repairing treatment may be performed in a process chamber, such as a high-pressure process chamber. In some embodiment, a carrier is mixed with a seam repairing precursor source at a predetermined ratio to form a gas mixture. The gas mixture is then flown into the high-pressure chamber. In some embodiments, an exhaust valve of the process chamber is closed when the gas mixture is flowing into the process chamber to increase the chamber process. When a pressure in the process chamber reach to a process pressure, the process chamber is then heated to a target temperature so that the carrier in the process chamber is converted to a super critical fluid phase. In some embodiments, the target pressure is on or above the critical point pressure of the carrier. The target temperature is on or above the critical point temperature of the carrier. At least one of the target temperature and target pressure is below a critical point pressure and a critical point temperature of the seam repairing precursor source so that the seam repairing precursor source does not reach its super critical fluid phase during operation.

Alternatively, the process chamber may be first heated to a temperature on or above the critical point temperature, the gas mixture is then flown to the process chamber until the carrier reaches the super critical fluid phase. In yet other embodiments, the pressure and temperature may be alternatively increased in two or more cycles.

Figure 4A:
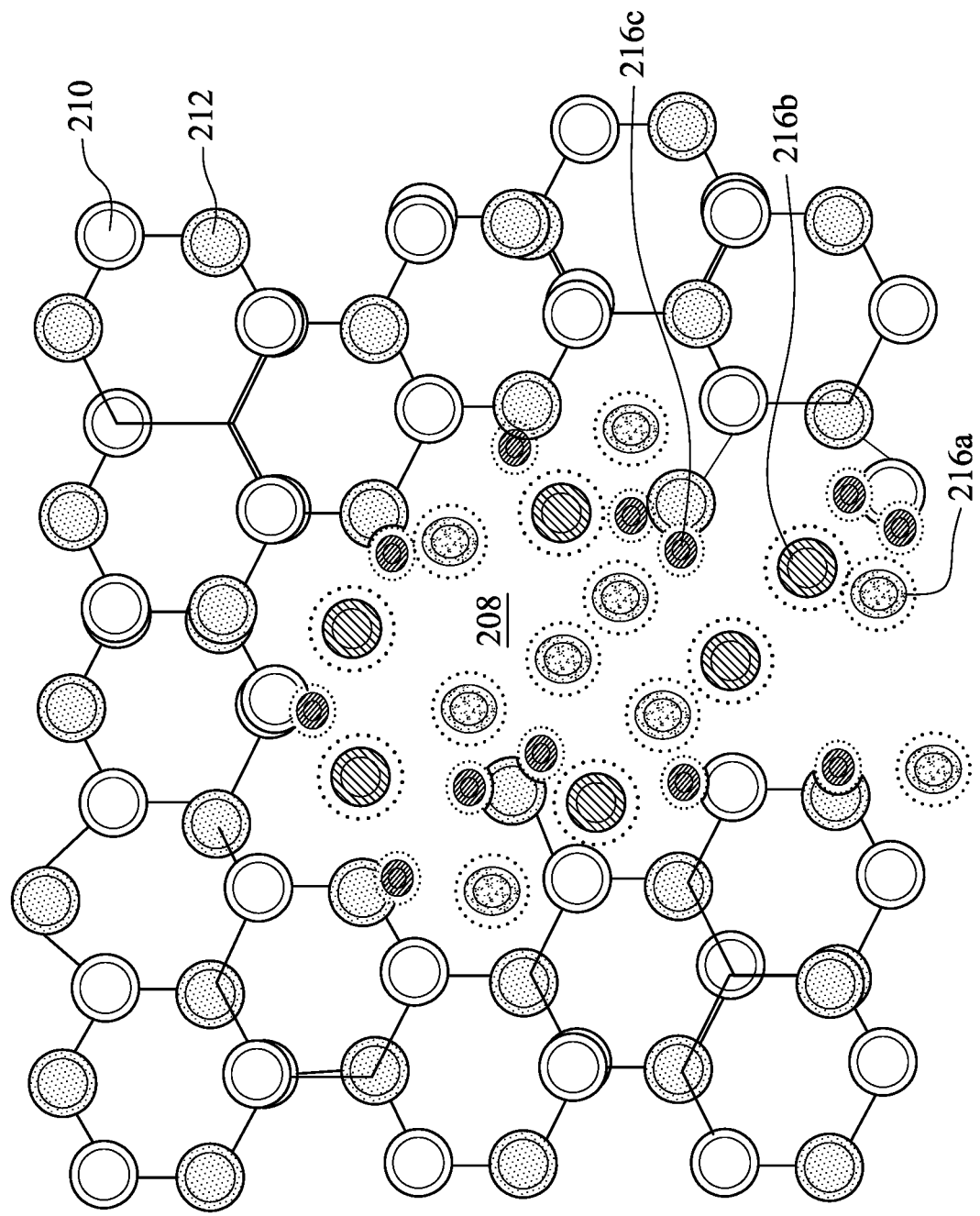

Not mean to be bound by theory, benefiting from the properties of the carrier at super crucial fluid phase, particle species from the seaming filling precursor source permeate through the filling material 206 and/or the material layer 202 to reach the seams 208. FIG. 4A is a schematic illustration of the crystalline structure of the filling material 206 near the seam 208, in area 4A marked in FIG. 4. In FIG. 4A, species 216a, 216b, 216c from the seam repairing precursor source permeate into the seam 208. The species 216a, 216b, 216c may be elements, carbon-hydrogen base, or other suitable species.

Figure 4B:
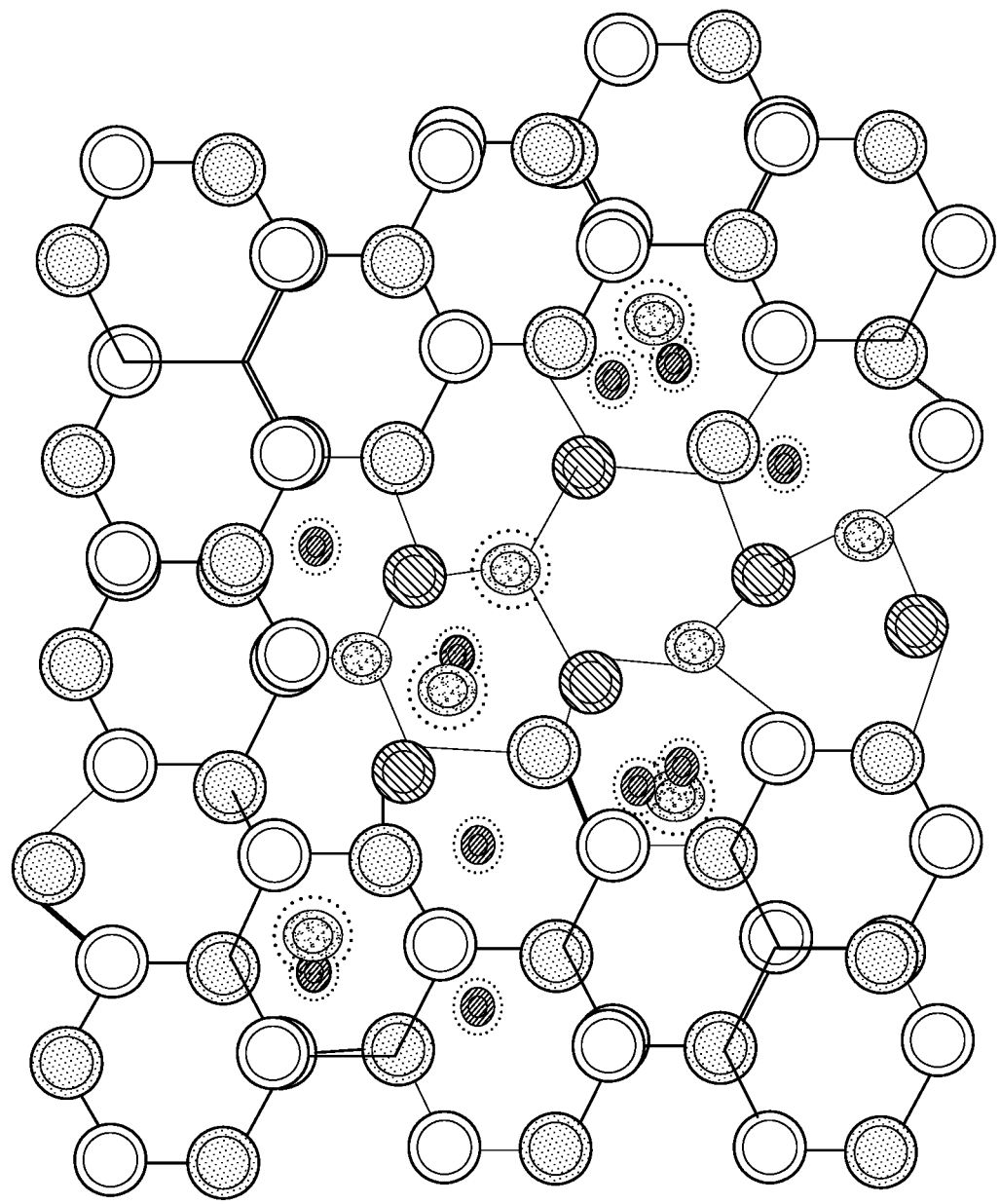

Once the carrier reaches the desired pressure and temperature at the super critical fluid phase, the pressure and temperature are held for a predetermined time period to allow repairing reaction between the filling material 206 and the seam repairing precursor. FIG. 4B is a schematic illustration of the crystalline structure of the filling material 206 near the seam 208, in area 4A marked in FIG. 4. In FIG. 4B, one or more species 216a, 216b, 216c from the seam repairing precursor source reacts with exposed atoms permeate into the seam 208. Some species 216a, 216b, 216c may react with the elements 210, 212 with dangling bonds and fill the seam 208 with a seam repairing material. In some embodiments, the repair time may be in a range between about 5 minutes and about 60 minutes.

After sufficient time for reaction to form the seam repairing material within the seams 208, the pressure in the process chamber is released, for example, to about 1 atmospheric pressure, and the temperature of the process chamber is also cooled down to complete the repair process and form the patch layer 214.

The seam repairing process may be performed to various filling materials. In some embodiments, the filling material 206 may be a dielectric material, such as silicon nitride ($Si_3N_4$), silicon carbide nitride (SiCN), silicon oxy-carbide (SiCO), silicon oxide ($SiO_2$) or the like, a conductive material, such as cobalt (Co), Molybdenum (Mo), tungsten (W), titanium nitride (TiN), or the like, and other suitable materials.

In some embodiments, the carrier may be selected from carbon dioxide ($CO_2$), or argon (Ar). The seam repairing precursor source may be selected according to the material of the patch layer 214 to be formed. The patch layer 214 may include the same material or different material from the filling material 206.

In some embodiments, when the material to be repaired is a dielectric material, such as a silicon and nitrogen containing material, the patch layer 214 may be formed using a seam repairing precursor source containing a nitrogen source, such as $NH_4OH$. Supper critical carbon dioxide may be used with one or more silane precursor to repair a dielectric film.

In some embodiments, when the material to be repaired is a dielectric material, the patch layer 214 may be a silicon containing material formed from a seam repairing precursor source containing a silicon source, such as a silane material. Supper critical carbon dioxide may be used with one or more silane precursor to repair a dielectric film. For example, the seam repairing precursor source may include one or more perhydridosilanes, such as silane ($SiH_4$), disilane ($Si_2H_6$), trisilane ($Si_3H_8$), n-tetrasilane ($Si_4H_{10}$), isotetrasilane ($Si_4H_{10}$), neoopentasilane ($Si_5H_{12}$), and the like; one or more hydridohalosilanes, such as monochlorosiliane ($SiH_3Cl$), dichlorosilane ($SiH_2Cl_2$), diiodosilane ($SiH_2I_2$), triiodosilane ($SiH_{13}$), and the like; one or more halosilanes, such as tetrachlorosilane ($SiCl_4$), hexachlorodisilane ($Si_2Cl_6$), octachlorotrisilane ($Si_3Cl_8$), tetrabromosilane ($SiBr_4$), tetraiodiosilane ($SiI_4$), and the like; one or more aminosilanes, such as trisilylamine ($Si_3H_9N$), bis(diethylamino)silane ($SiH_{22}CN_2$), bis(t-butylamino)silane ($SiH_{22}CN_2$), tris(isopropylanmino)silane ($SiH_{19}C_6N_3$), tris (isopropylamino)silane ($SiH_{25}C_9N_3$), tetrakis(dimethylanmino)silane ($SiH_{24}CN_4$), tri(isopropyl)cyclotrisilazane ($Si_3C_9H_{27}N_3$), tetramehtyldisilazane ($Si_2C_4H_{15}N$), and the like.

In some embodiments, the patch layer 214 may be a silicon containing material formed from a seam repairing precursor source. The silicon containing material may be used with Argon at super critical fluid phase. For example, the seam repairing precursor source may include one or more perhydridosilanes, such as silane (SiH4), disilane (Si2H6), and trisilane (Si3H8), one or more halosilanes, such as tetrachlorosilane (SiCl4), hexachlorodisilane (Si2Cl6), octachlorotrisilane (Si3Cl8), tetrabromosilane (SiBr4), tetraiodiosilane (SiI4), and the like, or the similar.

In some embodiments, when the material to be repaired is a conductive material, the patch layer 214 may be a conductive material formed from a seam repairing precursor source containing a metal compound, such as dicobalt octacarbonyl ($Co_2(CO)_8$), molybdenum chloride ($MoCl_5$), molybdenum hexacarbonyl ($Mo(CO)_6$), tungsten chloride ($WCl_5$), titanium chloride ($TiCl_4$), tungsten fluoride ($WF_6$), Tetrakis(dimethylamino)titanium $Ti(N(CH_3)_2)_4$, and any suitable material.

In some embodiments, the seam repairing source precursor may further include one or more gas additives, such as ammonia ($NH_3$) gas, hydrogen ($H_2$) gas, dimethylamine ($CH_3)_2NH_2$ gas, or the like. In some embodiments, the seam repairing precursor source may include a liquid additive, such as ammonium hydroxide ($NH_4OH$).

In some embodiments, the atomic ratio of the carrier and the repairing precursor source is in a range between about 100:1 and 100000:1. The process pressure is in a range between about 72 atm and about 300 atm. In some embodiments, when the carrier is $CO_2$, the process pressure is in a range between about 72 atm and about 200 atm. The process temperature may be in a range between about 25° C. and about 80000. In some embodiments, the process temperature is in a range between about 400° C. and about 800° C., for example about 600° C.

Table 1 below includes examples of precursor source mixture for repairing various materials according to the present disclosure.

| Material to be Repaired | Precursor Mixture |
| --- | --- |
| $Si_3N_4$ | $NH_3$ |
| $Si_3N_4$ | $NH_4OH$ |
| $Si_3N_4$ | $NH_4OH/SiH_4$ or $Si_2H_6$ or $Si_3H_8$ |
| $Si_3N_4$ | $NH_3/NH_4OH$ |
| $Si_3N_4$ | $SiH_4$ or $Si_2H_6$ or $Si_3H_8$ |
| $Si_3N_4$ | $NH_3/NH_4OH/SiH_4$ or $Si_2H_6$ or $Si_3H_8$ |
| $Si_3N_4$ | $NH_3/SiH_4$ |
| $Si_3N_4$ | $Si_2Cl_6/NH_3$ |
| $Si_3N_4$ | $N(SiH_3)_3/H_2/NH_3$ |
| SiCN | $CH_4$ or $C_2H_6$ |
| SiCN | $CH_4$ or $C_2H_6/NH_3$ |
| SiCN | $CH_4$ or $C_2H_6/SiH_4$ or $Si_2H_6$ or $Si_3H_8$ |
| SiCN | $CH_4$ or $C_2H_6/NH_3/SiH_4$ or $Si_2H_6$ or $Si_3H_8$ |
| SiCN | $Si_2Cl_6/CH_3—NH_2$ |
| SiCO | $((CH_3)_2SiO)_4/H_2/Ar$ |
| Co | $Co_2(CO)_8/H_2$ |
| Co | $CoCp(CO)_2/H_2/NH_3$ |
| Mo | $MoCl_5/NH_3$ |
| Mo | $Mo(CO)_6/NH_3$ |
| W | $WCl_5/H_2$ |
| W | $WF_6/Si_2H_6/SiH_4/B_2H_6$ |
| TiN | $Ti(N(CH_3)_2)_4/H_2/NH_3$ |
| TiN | $TiCl_4/NH_3/(CH_3)_2NH_2$ |

Figure 7:
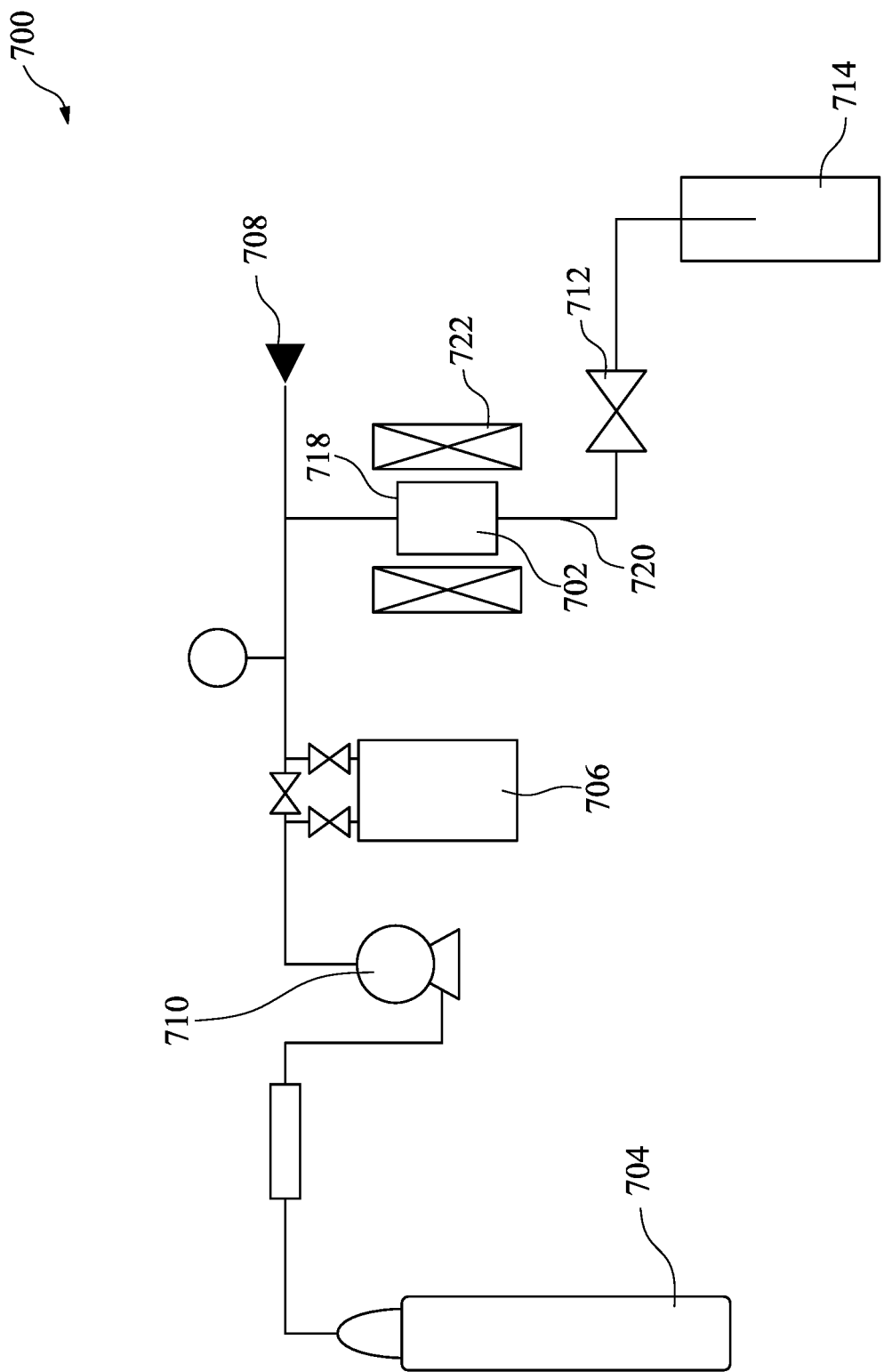
FIG. 7 is a schematic view of a process system for seam repairing according to embodiments of the present disclosure.

FIG. 7 is a schematic plan view of a process system 700. The process system 700 may be used to perform a seam repairing process according to embodiments of the present disclosure. The process system 700 may include a process chamber 702 having an inlet 718 and an outlet 720. During operation, one or more substrates to processed are disposed in the process chamber 702. A carrier reservoir 704 is connected to the inlet 718. A carrier, such as a $CO_2$ gas or Ar gas may be pumped to form the carrier reservoir 704 to the process chamber 702, for example by a pump 710. In some embodiments, a precursor reservoir 706 may be connected to a flow path between the carrier reservoir 704 and the inlet 718 so that a seam repairing precursor source, such as silanes, metal compound, may be mixed with the carrier prior to entering the process chamber 702. In some embodiments, a additive reservoir 708 may be connected to the flow path between the carrier reservoir 704 and the inlet 718 so that one or more additives, such as ammonium hydroxide, ammonia, hydrogen, or the like, may be mixed with the carrier prior to entering the process chamber 702.

The outlet 720 of the process chamber 702 is connected to an exhaust assembly 714 via a valve 712. The valve 712 may be closed to allow pressure building in the process chamber 702 during operation. The valve 712 may be opened to release pressure in the process chamber 702. The process system 700 further includes one or more heating element 722 to heat the process chamber 702 to a desired temperature.

Figure 4C:
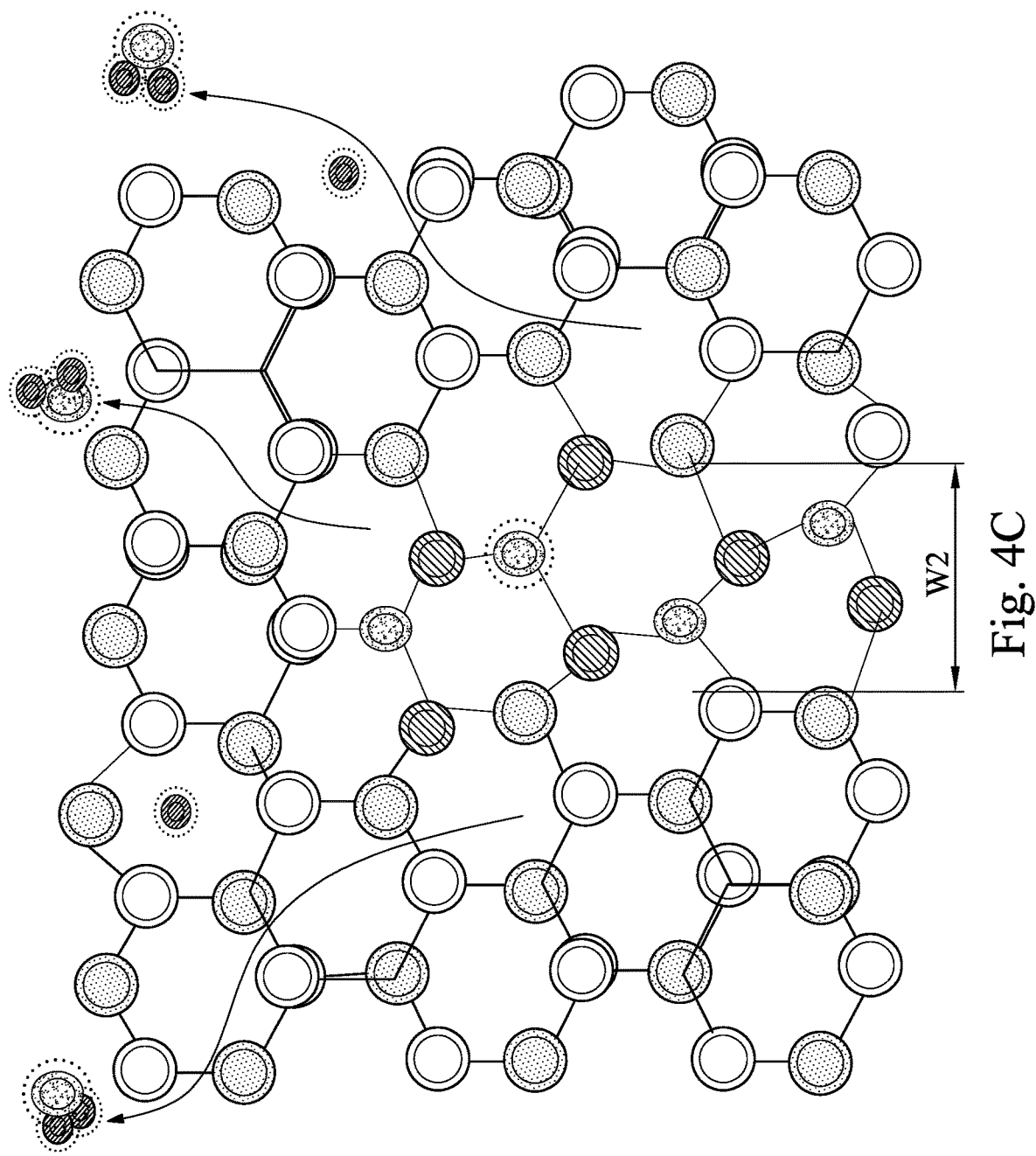

At operation 108, an anneal process may be performed to remove any residual species. FIG. 4C is a schematic illustration of the crystalline structure of the filling material 206 near the seam 208, in area 4A marked in FIG. 4, after an anneal process. In FIG. 4C, the unreacted species 216a, 216b, 216c or other radicals and interstitial atoms from the seam repairing precursor source may exit the filling material 206 and the patch layer 214 during the anneal operation. As shown in FIG. 4C, the patch layer 214 may have a width W2. In some embodiment, the width W2 is in a range between 0 nm and 2 nm.

Figure 5:
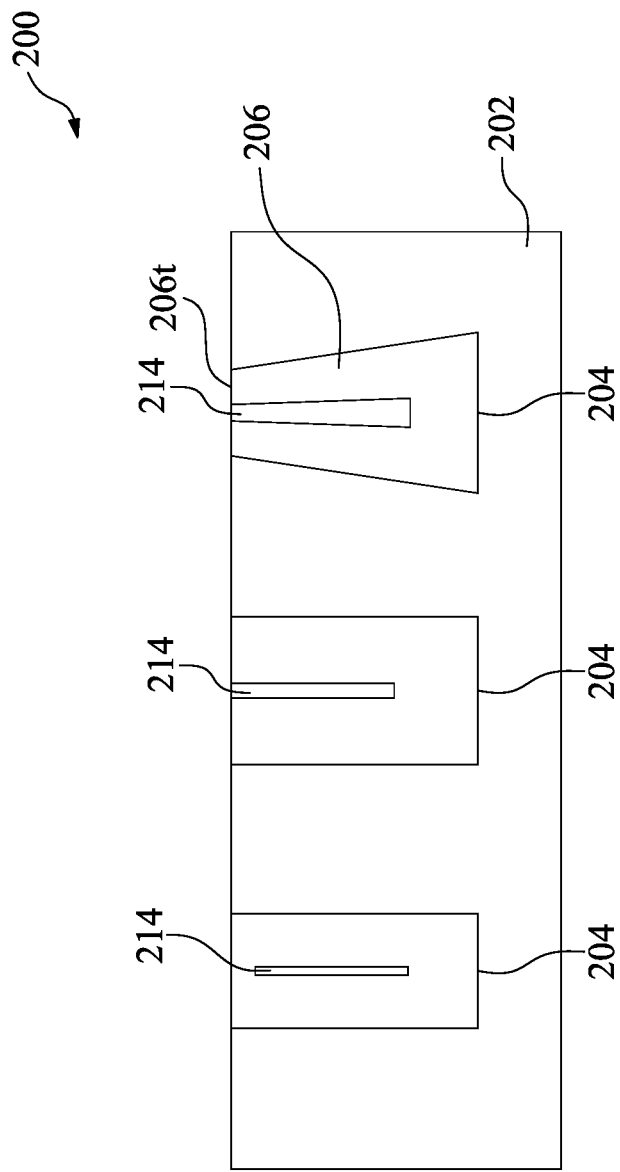
Figure 6:
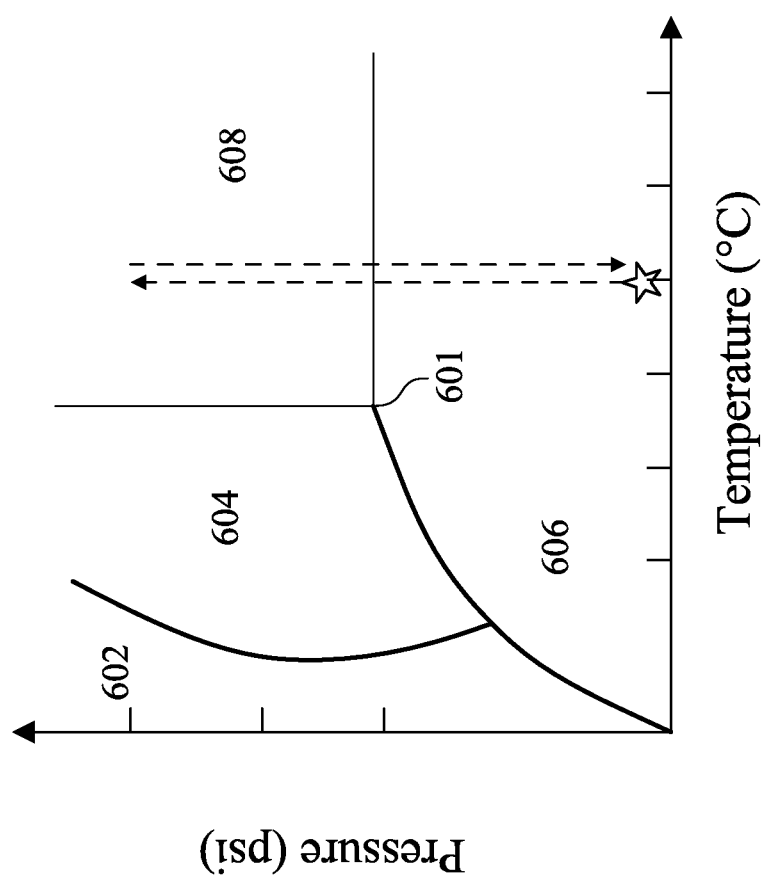
FIG. 6 is a phase chart of a carbon dioxide showing process conditions according to embodiments of the present disclosure.

At operation 110, excessive amount of the filling material 206 is removed from the trench or via opening 204, as shown in FIG. 5. In some embodiments, an etch process may be performed etch back the excessive material. In other embodiments, a planarization process, such as chemical mechanical polishing. In the Example of FIG. 5, after removal of the excessive amount of the filling material 206, a top surface 206t is formed. Depending on the location of the seam 208 within the filling material, the seam 208 may be exposed to the top surface 206t. Because the patch layer 214 is formed in the seam 208, exposure of the seam 208 does not result in any damages to the filling material 206.

Figure 8:
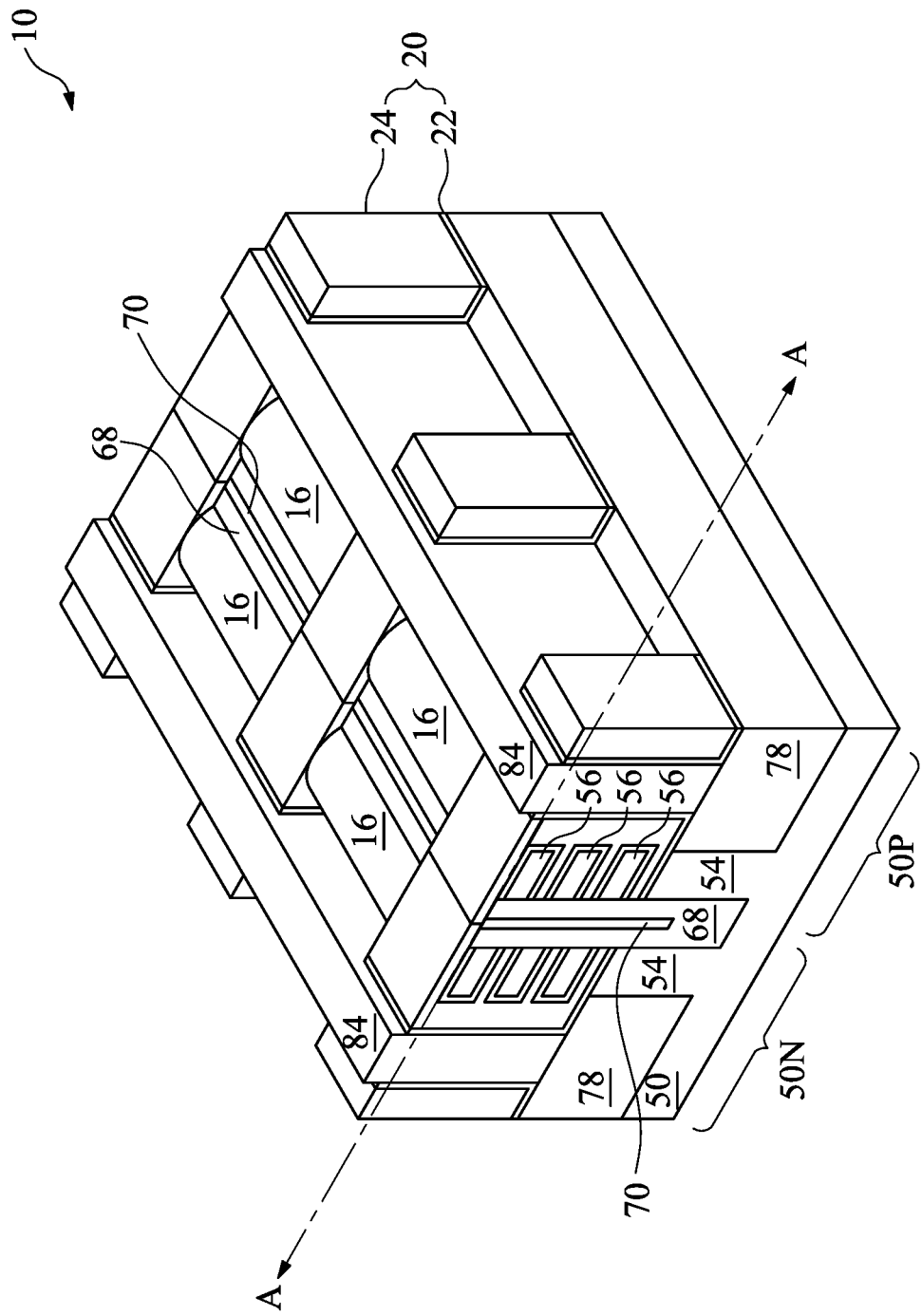
FIGS. 8-14 schematically demonstrate a semiconductor device with a forksheet structure having repaired seams according to embodiments of the present disclosure.

The method 100 according to the present disclosure may be used to repair any seam lines in a filling material in a semiconductor device. For example, the method 100 may be used to repair a dielectric wall in a forksheet structure, such as a forksheet field-effect transistor (FET). FIG. 8 schematically illustrates an example of simplified semiconductor device 10 in accordance with some embodiments. FIG. 8 is a cutaway three-dimensional view, where some features of the semiconductor device 10 are omitted for illustration clarity. In the illustrated embodiment, the semiconductor device 10 includes forksheet FETs. The semiconductor device 10 may also be nanosheet field-effect transistors (NSFETs), nanowire field-effect transistors (NWFETs), gate-all-around field-effect transistors (GAAFETs), or the like.

The semiconductor device 10 may include nanostructures 56 over a substrate 50, such as over fins 54 extending from the substrate 50. The nanostructures 56 are semiconductor layers that act as channel regions for the semiconductor device 10. Isolation regions 78, such as shallow trench isolation (STI) regions, are disposed over the substrate 50 and adjacent to the semiconductor fins 54. Although the isolation regions 78 are described/illustrated as being separate from the substrate 50, as used herein, the term "substrate" may refer to the substrate 50 alone or a combination of the substrate 50 and the isolation regions 78. Additionally, although the semiconductor fins 54 are illustrated as single, continuous materials with the substrate 50, the semiconductor fins 54 and/or the substrate 50 may include a single material or multiple materials. In this context, the semiconductor fins 54 refer to the portion extending above and from between the neighboring isolation regions 78.

Gate structures 20 are wrapped around the nanostructures 56 and are disposed over the semiconductor fins 54. The gate structures 20 include gate dielectrics 22 and gate electrodes 24. The gate dielectrics 22 are along top surfaces, sidewalls, and bottom surfaces of the nanostructures 56 and may extend along sidewalls and/or over top surfaces of the semiconductor fins 54. The gate electrodes 24 are on the gate dielectrics 22. Epitaxial source/drain regions 16 are disposed on opposite sides of the gate structures 20. In embodiments where multiple transistors are formed, the epitaxial source/drain regions 16 may be shared between various transistors. One or more interlayer dielectric (ILD) layer(s) are over the epitaxial source/drain regions 16 and/or the gate structures 20, through which contacts to the epitaxial source/drain regions 16 and the gate electrodes 24 are formed.

The substrate 50 has a n-type region 50N and a p-type region 50P. The n-type region 50N includes n-type devices, such as NMOS transistors, e.g., n-type semiconductor device, and the p-type region 50P includes p-type devices, such as PMOS transistors, e.g., p-type semiconductor device. In the illustrated embodiment, the semiconductor device 10 are forksheet FETs. In forksheet FETs, both n-type devices and p-type devices are integrated in a same forksheet structure. A dielectric wall 68 separates the semiconductor fin 54, the nanostructures 56 and the epitaxial source/drain regions 16 for a n-type device from the semiconductor fin 54, the nanostructures 56 and the epitaxial source/drain regions 16 for a p-type device. In some embodiments, the dielectric wall 68 is formed by a conformal deposition method with a seam formed along the center line. The dielectric wall 68 is repaired using a super critical fluid carrier and a patch layer 70 may be formed in the seam. The gate structures 20 extend along three sides of each nanostructure 56. Forksheet FETs allow n-type devices and p-type devices to be formed close to one another, and allow the gate structures 20 for the devices to be physically and electrically coupled to one another, thereby reducing the amount of gate contacts used in a CMOS process. Dielectric fins 84 are formed over the isolation regions 78 at cell boundaries, separating adjacent forksheet FETs. FIG. 9-14 are cross-sectional views of the semiconductor device 10 along line A-A in FIG. 8 at intermediate stages in the manufacturing in accordance with some embodiments.

Figure 9:
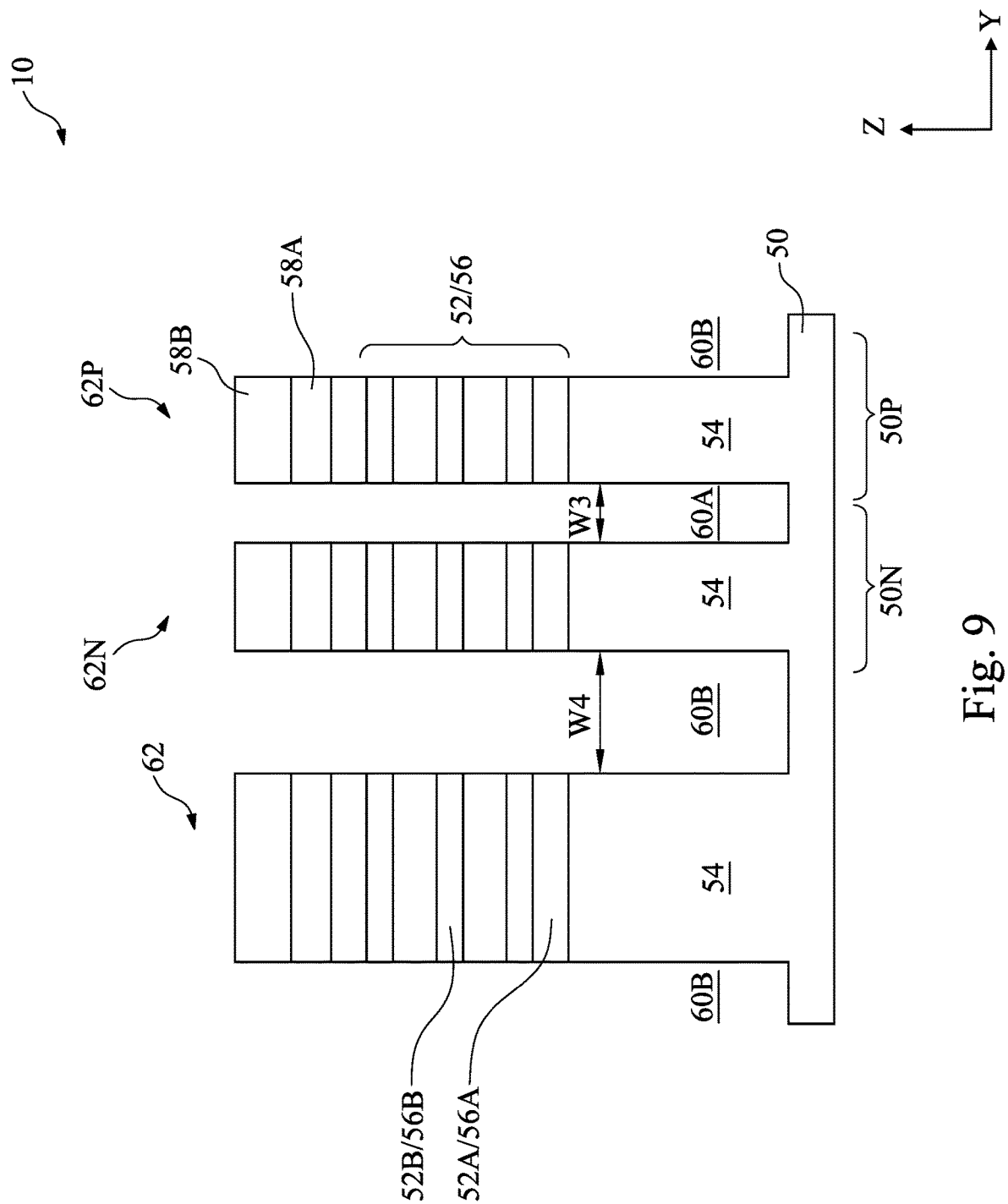

In FIG. 9, fin structures 62 are formed on the substrate 50. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 has a n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. As discussed in greater detail below, although one n-type region 50N and one p-type region 50P are illustrated, the substrate 50 can include any desired quantity of such regions.

A multi-layer stack 52 is formed over the substrate 50. The multi-layer stack 52 includes alternating first semiconductor layers 52A and second semiconductor layers 52B. The first semiconductor layers 52A are formed of a first semiconductor material, and the second semiconductor layers 52B are formed of a second semiconductor material. The semiconductor materials may each be selected from the candidate semiconductor materials of the substrate 50. In the illustrated embodiment, the multi-layer stack 52 includes four layers of each of the first semiconductor layers 52A and the second semiconductor layers 52B. It should be appreciated that the multi-layer stack 52 may include any number of the first semiconductor layers 52A and the second semiconductor layers 52B. For example, the multi-layer stack 52 may include from about three to about ten layers of each of the first semiconductor layers 52A and the second semiconductor layers 52B.

In some embodiment, the second semiconductor layers 52B will be used to form channel regions for the nano-FETs in both the n-type region 50N and the p-type region 50P. The first semiconductor layers 52A are sacrificial layers (or dummy layers), which will be removed in subsequent processing to expose the top surfaces and the bottom surfaces of the second semiconductor layers 52B in both regions. The second semiconductor material of the second semiconductor layers 52B is a material suitable for both n-type and p-type nano-FETs, such as silicon, and the first semiconductor material of the first semiconductor layers 52A is a material that has a high etching selectivity from the etching of the second semiconductor material, such as silicon germanium. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may be formed to a small thickness, such as a thickness in the range of about 5 nm to about 30 nm. In some embodiments, one group of layers (e.g., the second semiconductor layers 52B) is formed to be thinner than another group of layers (e.g., the first semiconductor layers 52A). The relative thicknesses of the layers can be based on the desired channel height and the channel work function requirements of the resulting nano-FETs.

As trenches 60 are etched in the substrate 50 and the multi-layer stack 52 to form the fin structures 62 (including fin structures 62N in the n-type region 50N and fin structures 62P in the p-type region 50P). Each of the fin structure 62 may include a semiconductor fin 54 and nanostructures 56. The semiconductor fins 54 are semiconductor strips patterned in the substrate 50. In embodiments where the substrate 50 is a SOI substrate, the semiconductor fins 54 include the remaining portions of the semiconductor layer 50A. The nanostructures 56 include the remaining portions of the multi-layer stack 52 on the semiconductor fins 54. Specifically, the nanostructures 56 include alternating first nanostructures 56A and second nanostructures 56B. The first nanostructures 56A and the second nanostructures 56B are formed of remaining portions of the first semiconductor layers 52A and the second semiconductor layers 52B, respectively. In the illustrated embodiment, the second nanostructures 56B are each disposed between two of the first nanostructures 56A. The etching may be any acceptable etch process, such as a reactive ion etch (RIE), neutral beam etch (NBE), the like, or a combination thereof, and may be performed with masks 58 having a pattern of the fin structures 62. The etching may be anisotropic.

The masks 58 may be single layered masks, or may be multi-layered masks, such as multi-layered masks that each include a first mask layer 58A and a second mask layer 58B on the first mask layer 58A. The first mask layer 58A and the second mask layer 58B may each be formed from a dielectric material such as silicon oxide, silicon nitride, a combination thereof, or the like, and may be deposited or thermally grown according to acceptable techniques. The material of the first mask layer 58A may have a high etching selectivity from the etching of the material of the second mask layer 58B. For example, the first mask layer 58A may be formed of silicon oxide, and the second mask layer 58B may be formed of silicon nitride.

The fin structures 62 may be patterned by any suitable method. For example, the fin structures 62 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 62. In some embodiments, the masks 58 (or other layer) may remain on the fin structures 62.

The fin structures 62 can have widths in the range of about 5 nm to about 20 nm. The fin structures 62 in the n-type region 50N and the p-type region 50P are illustrated as having substantially equal widths for illustrative purposes. In some embodiments, the fin structures 62 in one region (e.g., the n-type region 50N) may be wider or narrower than the fin structures 62 in the other region (e.g., the p-type region 50P).

The fin structures 62 are formed in adjacent pairs. Each pair of the fin structures 62 will be used to form forksheet FETs. One fin structure 62N of each pair will be used to form a n-type device, and the other fin structure 62P of each pair will be used to form a p-type device. The fin structures 62N, 62P of each pair are separated by corresponding first ones of the trenches 60A. A dielectric wall (discussed in greater detail below) will be formed in the trench 60A between the fin structures 62N, 62P of each pair, thus providing electrical isolation between the nano-FETs of different types that will be formed in the fin structures 62N, 62P. The trenches 60A can have a trench width W3 in the range of about 6 nm to about 30 nm. Adjacent pairs of the fin structures 62 are separated by corresponding second ones of the trenches 60B. The trenches 60B can have a trench width W4 in the range of about 22 nm to about 46 nm. The trench width W4 is greater than the trench width W3, so that adjacent pairs of fin structures 62 are spaced apart further than the fin structures 62N, 62P of each pair.

Figure 10:
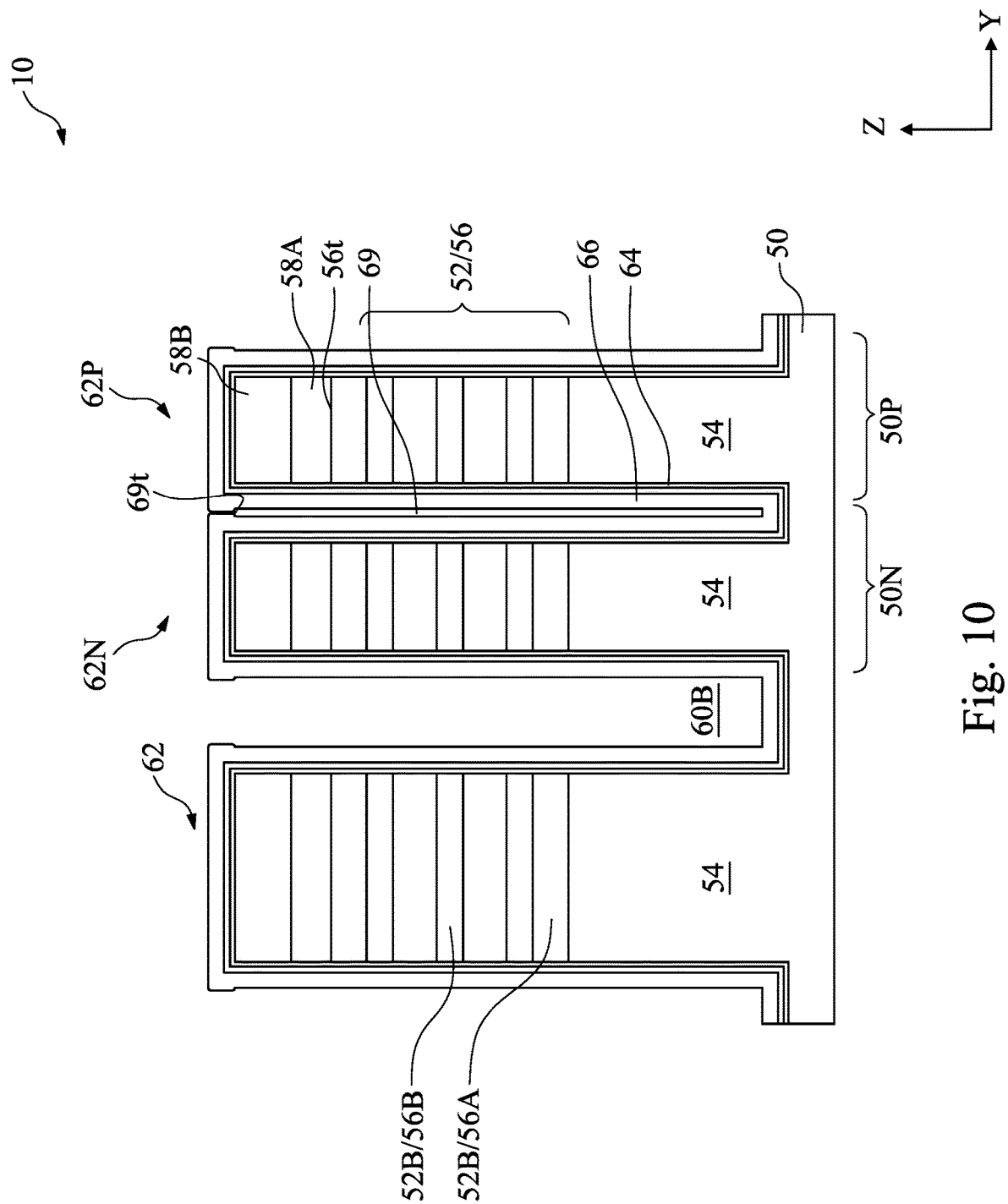

In FIG. 10, dielectric filling materials are deposited in the trench 60A for the dielectric wall 68. In some embodiments, a liner layer 64 is formed over the masks 58 (if present), the fin structures 62, and the substrate 50. The liner layer 64 will be used to separate the fin structures 62 from subsequently formed contacts. The liner layer 64 may be formed of a dielectric material, which may be formed by thermal oxidation or a conformal deposition process. Acceptable dielectric materials include low-k dielectric materials (e.g., those having a k-value of less than about 7) such as silicon oxide, silicon nitride, silicon carbonitride, silicon oxycarbide, silicon oxycarbonitride, or the like; high-k dielectric materials (e.g., those having a k-value of greater than about 7) such as hafnium oxide, zirconium oxide, zirconium aluminum oxide, hafnium aluminum oxide, hafnium silicon oxide, aluminum oxide, or the like; combinations thereof; or the like. In some embodiments, the liner layer 64 is formed of silicon oxide by thermal oxidation. The liner layer 64 can be formed to a thickness in the range of about 1 nm to about 10 nm.

A dielectric layer 66 is then formed over the liner layer 64. The dielectric layer 66 may be formed of a low-k dielectric material, which is deposited by a conformal deposition process, such as ALD, chemical vapor deposition (CVD), molecular-beam deposition (MBD), physical vapor deposition (PVD), or the like. In some embodiments, the dielectric layer 66 is conformally deposited by ALD. The dielectric layer 66 may be silicon nitride, silicon carbonitride, silicon oxycarbide, silicon oxide, silicon oxycarbonitride, or the like; high-k dielectric materials (e.g., those having a k-value of greater than about 7) such as hafnium oxide, zirconium oxide, zirconium aluminum oxide, hafnium aluminum oxide, hafnium silicon oxide, aluminum oxide, or the like; combinations thereof; or the like. In some embodiments, the material of the dielectric layer 66 has a different k-value than the material of the liner layer 64, and has a high etching selectivity from the etching of the material of the liner layer 64. In some embodiments, the dielectric layer 66 is formed of silicon nitride by ALD or CVD.

Because the trenches 60A, 60B have different widths, the trenches 60A, 60B are filled with different amount of dielectric material. The liner layer 64 is formed along the sidewalls and the bottoms of the trenches 60A, 60B. Because the trenches 60A is narrower, the trenches 60A are filled or overfilled by the dielectric layer 66 while the trenches 60B are only partially filled by the dielectric layer 66.

As shown in FIG. 10, the dielectric layer 66 is deposited and substantially fills the trenches 60A with a central seam 69 formed within the dielectric layer 66 within the trenches 60A. The central seam 69 is a result of uniform deposition in a trench structure. Particularly, the central seam 69 may be formed within the trench 60A as surfaces of conformal deposition meet when the trench 60A are substantially filled.

The central seam 69 may extend along the height of the trench 60A in the vertical direction. The central seams 69 may start at different vertical levels and of different lengths depending on the geometry of the trenches 60A. In some embodiments, a tip 69t of the central seam 69 may extend above a top surface 56t of the nanostructures 56. If left untreated, the central seam 69 may be exposed in subsequent etch back processes causing uneven etching or even damages to the dielectric layer 66.

Figure 11:
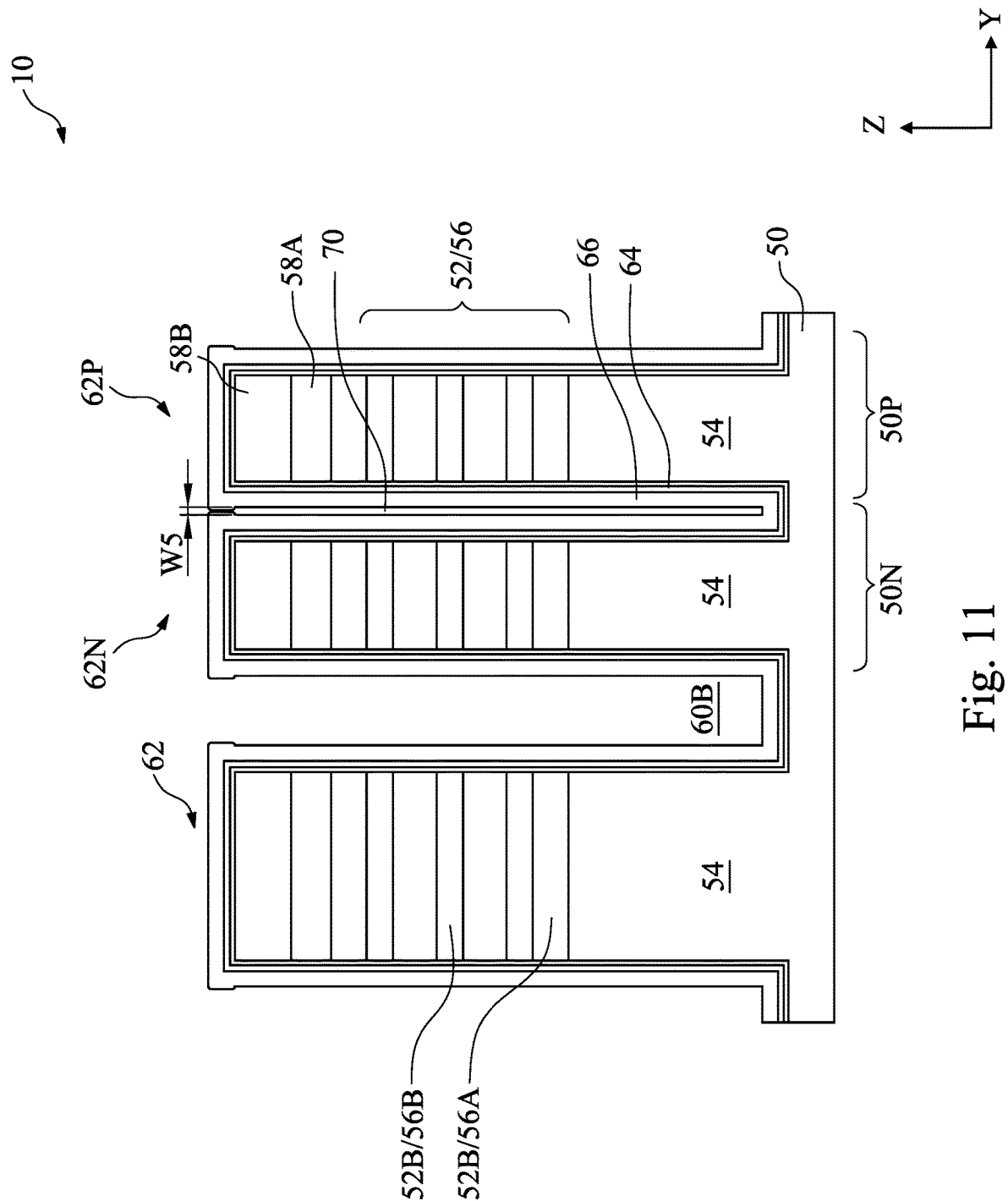

In FIG. 11, a seam repairing process is performed to form the patch layer 70 in the central seam 69. The seam repairing process may be performed according to operation 106 of the method 100 described above. Particularly, the seam repairing process may be using a carrier at super critical fluid phase to deliver a seam repairing precursor source to the central seam 69.

In some embodiments, the seam repairing treatment may be performed by positioning the substrate 50 in a process chamber, mixing a carrier with a seam repairing precursor source, flowing a gas mixture comprising a carrier and a seam repairing precursor source into a process chamber to build up chamber pressure, heating the gas mixture in the process chamber so that the carrier reaches a super critical fluid phase, holding the pressure and temperature for a pre-determined period of time to allow the patch layer 70 to form within the central seam 69, releasing the chamber pressure, and cooling down. In some embodiments, an anneal process, similar to the anneal process in operation 108, may be performed after the seam repairing treatment.

The carrier may be selected from carbon dioxide ($CO_2$), or argon (Ar). In some embodiments, the carrier is $CO_2$. The patch layer 70 may include the same material or different material from the dielectric layer 66. In some embodiments, the patch layer 70 may be formed using a seam repairing precursor source selected from suitable combinations in Table 1.

In some embodiments, the patch layer 70 may include silicon nitride. In some embodiments, the seam repairing precursor source may include $NH_4OH$. In some embodiments, the seam repairing precursor source may include a silane, such as $SiH_4$ or $Si_2H_6$ or $Si_3H_8$. In some embodiments, the seam repairing precursor source may include $NH_3$. In some embodiments, the seam repairing precursor source may include $NH_4OH$ and $NH_3$. In some embodiments, the seam repairing precursor source may include $NH_4OH$ and a silane, such as $SiH_4$ or $Si_2H_6$ or $Si_3H_8$. In some embodiments, the seam repairing precursor source may include $NH_3$ and a silane, such as $SiH_4$ or $Si_2H_6$ or $Si_3H_8$. In some embodiments, the seam repairing precursor source may include $NH_4OH$, $NH_3$, and a silane, such as $SiH_4$ or $Si_2H_6$ or $Si_3H_8$.

In some embodiments, the patch layer 70 may include silicon carbide nitride. In some embodiments, the seam repairing precursor source may include a carbon source, such as, $CH_4$, $C_2H_6$, or other suitable carbon gas. In some embodiments, the seam repairing precursor source may include a carbon source, such as, $CH_4$, $C_2H_6$, and a silane, such as $SiH_4$ or $Si_2H_6$ or $Si_3H_8$. In some embodiments, the seam repairing precursor source may include a carbon source, such as, $CH_4$, $C_2H_6$, and a silane, such as $SiH_4$ or $Si_2H_6$ or $Si_3H_8$ and $NH_3$.

The process pressure may be in a range between about 72 atm and about 300 atm, for example in a range between about 72 atm and 200 atm. The process temperature may be in a range between about 31° C. and about 800° C., for example in a range between about 400° C. and about 800° C.

After the seam repairing treatment, the patch layer 70 is formed within the central seam 69. The patch layer 70 may extend along a central plane of the trench 60A and have a thickness W5 in a range between about 0 nm and about 2 nm. The patch layer 70 may be silicon nitride, silicon carbonitride, silicon oxycarbide, silicon oxide, silicon oxycarbonitride, or similar.

Figure 12:
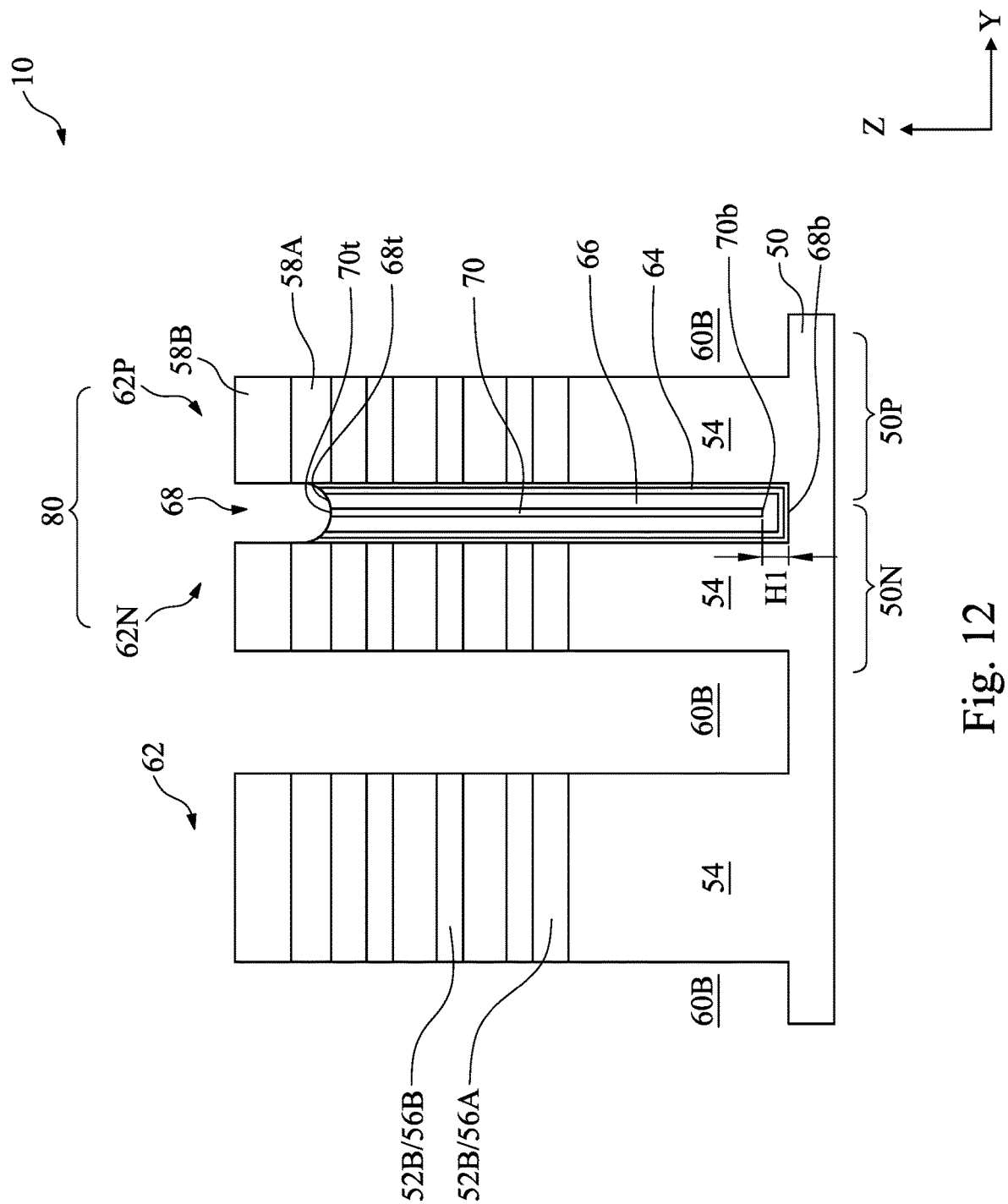

In FIG. 12, the dielectric layer 66 is etched back to remove some portions of the dielectric layer 66. Specifically, the portions of the dielectric layer 66 in the trenches 60B and over the masks 58 (if present) or the fin structures 62 are removed by the etch back, thus reforming the trenches 60B. The dielectric layer 66 is etched back using acceptable etching techniques, such as with an etching process that is selective to the dielectric layer 66 (e.g., etches the material(s) of the dielectric layer 66 at a faster rate than the material(s) of the liner layer 64). After etching back is complete, the remaining portions of the dielectric layer 66 are in the trenches 60A. The remaining portions of the dielectric layer 66 form the dielectric walls 68 separating the fin structures 62N, 62P of each pair of the fin structures 62. The dielectric walls 68 may partially or fully fill the trenches 60A. The dielectric walls 68 can have the width W3 in the range of about 6 nm to about 30 nm. After the dielectric layers 66 are formed, forksheet structures 80 extend from the substrate 50. The forksheet structures 80 each include the dielectric wall 68 and a pair of fin structures 62, with the dielectric wall 68 disposed between the fin structures 62. As noted above, although one n-type region 50N and one p-type region 50P are illustrated, the substrate 50 can include any desired quantity of such regions. Each forksheet structure 80 is disposed at the boundaries of a n-type region 50N and a p-type region 50P.

The present of the patch layer 70 prevents undesired excessive etching to the dielectric layer 66 when the central seam 69 is exposed to the etch chemistry during etch back, thus, maintaining the integrity of the dielectric wall 68. As shown in FIG. 12, the dielectric wall 68 includes the patch layer 70 formed a long the central line. The patch layer 70 may extend from a top point 70*t* along the central line of the trench 60A to a bottom point 70*b*. In some embodiments, the top point 70*t* of the patch layer 70 may be co-planar or align with a top surface 68*t* of the dielectric wall 68. The bottom point 70*b* may be positioned at above a bottom surface 68*b* of the dielectric wall 68. In some embodiments, the bottom point 70*b* may be positioned at a height H1 above the bottom surface 68*b* of the dielectric wall 68. In some embodiments, the height H1 is a range between about 2 nm and about 15 nm.

Figure 13:
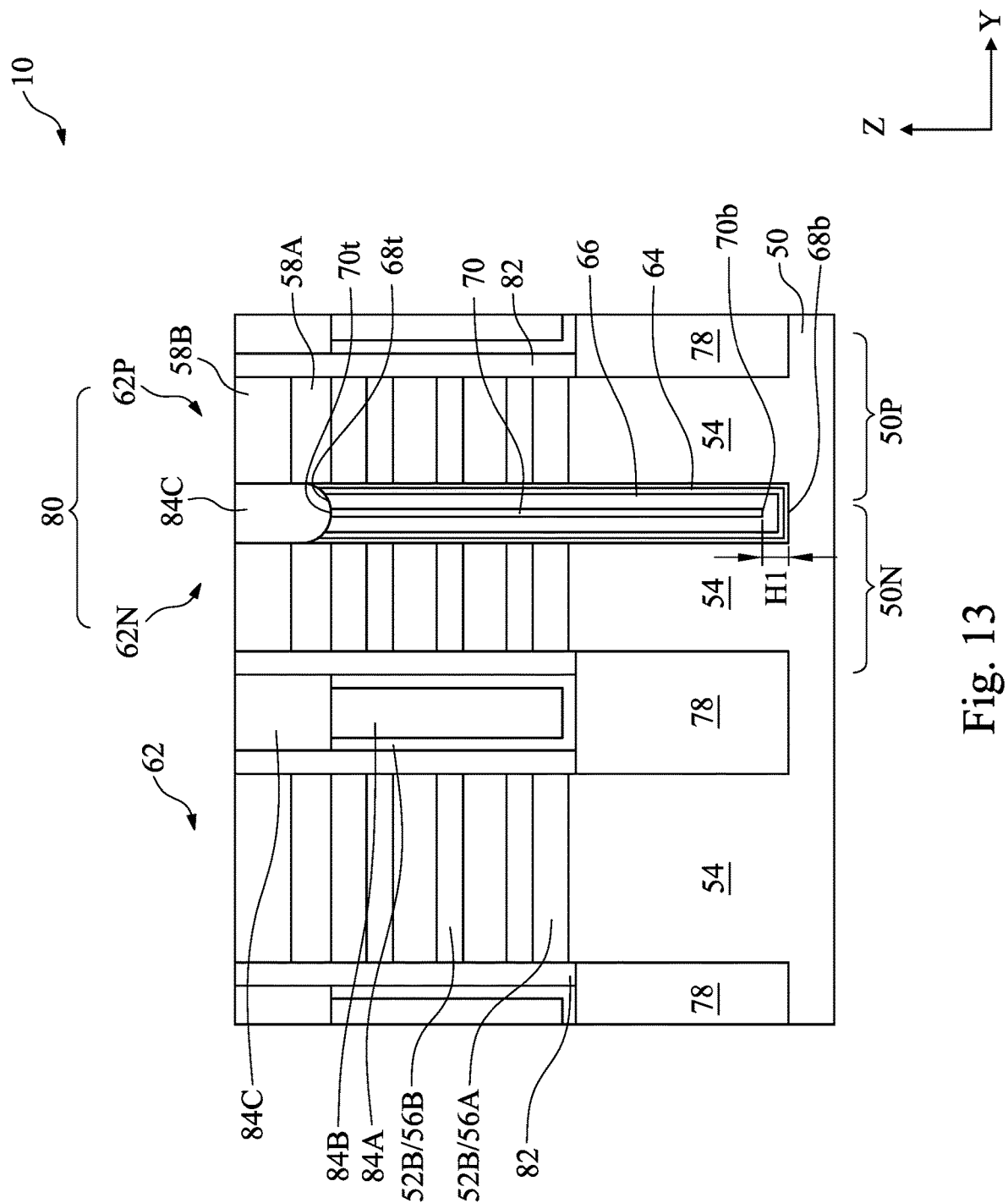

Subsequently, Isolation regions 78 are formed by conformally deposit an insulation material in the remaining portions of the trenches 60A, adjacent the forksheet structures 80 and then recessed back, as shown in FIG. 13. The insulation material may be deposited on the masks 58 (if present) or the fin structures 62, and in the trenches 60A, 60B. The insulation material 76 may be an oxide such as silicon oxide, a nitride such as silicon nitride, the like, or a combination thereof, and may be formed by high-density plasma CVD (HDP-CVD), flowable CVD (FCVD), the like, or a combination thereof. Other insulation materials formed by any acceptable process may be used. The insulation material is recessed such that at least a portion of the nanostructures 56 protrude from the Isolation regions 78. In the illustrated embodiment, the top surfaces of the Isolation regions 78 are below the top surfaces of the semiconductor fins 54.

After formation of the Isolation regions 78, channel spacers 82 are formed over and around the forksheet structures 80, e.g., in portions of the trenches 60B. The channel spacers 82 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like.

Dielectric fins 84 are formed between the channel spacers 82 and on the Isolation regions 78, e.g., in the remaining portions of the trenches 60B that are unfilled by the channel spacers 82. The dielectric fins 84 may be formed of a low-k dielectric material (such as one selected from the candidate dielectric materials of the liner layer 64), a high-k dielectric material (such as one selected from the candidate dielectric materials of the liner layer 64), combinations thereof, or the like, which may be formed by thermal oxidation or a conformal deposition process (such as one selected from the candidate methods of forming the liner layer 64). In the illustrated embodiment, each dielectric fin 84 includes a first dielectric layer 84A and a second dielectric layer 84B on the first dielectric layer 84A, with the first dielectric layer 84A formed of silicon carbonitride, silicon oxycarbide, or silicon oxycarbonitride, and the second dielectric layer 84B formed of silicon oxide. The dielectric fins 84 can have a width W5 in the range of about 6 nm to about 30 nm.

A removal process is then applied to the dielectric fins 84 to remove excess material(s) of the dielectric fins 84 over the channel spacers 82. In some embodiments, a planarization process such as a chemical mechanical polish (CMP), an etch-back process, combinations thereof, or the like may be utilized. The planarization process exposes the channel spacers 82 such that top surfaces of the channel spacers 82 and the dielectric fins 84 are coplanar (within process variations) after the planarization process is complete.

A third dielectric layer 84C may be deposited by a conformal deposition process (such as one selected from the candidate methods of forming the liner layer 64). The dielectric layer 84C may include one or more high-k dielectric materials. A removal process is then applied to remove excess material(s) of the third dielectric layers 84C and the channel spacers 82 over the masks 58 (if present) or the fin structures 62. In some embodiments, a planarization process such as a chemical mechanical polish (CMP), an etch-back process, combinations thereof, or the like may be utilized. The planarization process exposes the masks 58 or the nanostructures 56 such that top surfaces of, respectively, the masks 58 or the nanostructures 56, the channel spacers 82, and the third dielectric layers 84C are coplanar (within process variations) after the planarization process is complete. In the illustrated embodiment, the masks 58 remain after the planarization process. In another embodiment, the masks 58 may also be removed by the planarization process.

Figure 14:
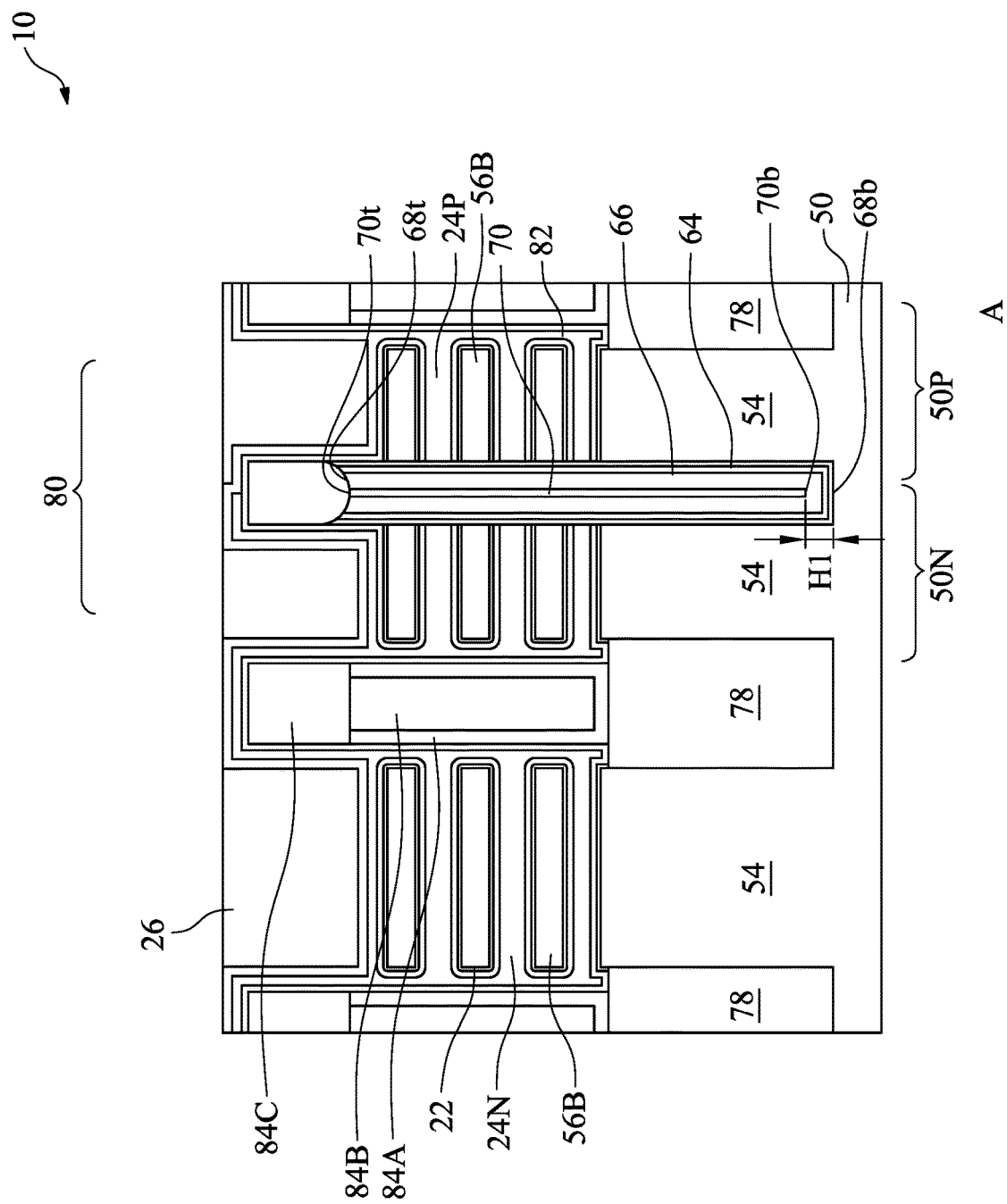

Dummy gate structures, not shown, may then be formed. Portions of the fin structures 62 not covered by the dummy gate structures are then etched back. The epitaxial source/drain regions 16, shown in FIG. 9, are then formed between the dummy gate structures. A contact etch stop layer (CESL) and an interlayer dielectric (ILD) layer are then sequentially formed over the epitaxial source/drain regions 16. Replacement gate processes are then performed to form the gate structures 20. As shown in FIG. 14, the gate structures 20 include the gate dielectrics 22 and the gate electrodes 24 on the gate dielectrics 22. The gate structures 20 may also be referred to as "gate stacks." In some embodiments, a self aligned contact (SAC) layer 26 may be formed over the gate electrodes 24.

Embodiments of the present disclosure provide various advantages. Seams resulting from conformal deposition in trench structures are successfully repaired and patched up by delivering seam repair precursor source with a carrier at super critical liquid phase. The seam repair methods according to the present disclosure may be used to repair a variety of films, such as dielectric films, conductive features, to improve device performance, and reduce rate of failure. The repairing process may be preformed at a relatively low temperature, therefore, without thermal budget concerns.

Some embodiments provide a method of forming a semiconductor structure. The method comprises forming a trench structure in a substrate; filling the trench structure by conformally deposit a first material in the trench structure; treating the first material comprising: exposing the first material to a gas mixture comprising a carrier and a seam repairing precursor; converting the carrier to a super critical fluid phase; and forming a patch layer in a seam of the first material with the seam repairing precursor while the carrier is in the super critical fluid phase; and removing a portion of the first material.

Some embodiments provide a method of forming a semiconductor structure. The method comprises forming a trench structure in a substrate; filling the trench structure by conformally deposit a first material in the trench structure; treating the first material comprising: exposing the first material to a gas mixture comprising a carrier and a seam repairing precursor; converting the carrier to a super critical fluid phase; and forming a patch layer in a seam of the first material with the seam repairing precursor while the carrier is in the super critical fluid phase; and removing a portion of the first material.

Some embodiments provide a semiconductor device, comprising a first nanostructure; a second nanostructure; a first source/drain region adjacent the first nanostructure; a second source/drain region adjacent the second nanostructure; and a dielectric wall between the first nanostructure and the second nanostructure and between the first source/drain region and the second source/drain region, wherein the dielectric wall comprises: a first dielectric layer substantially filling a trench between the first and second nanostructures, wherein the first dielectric layer has a central seam; and a patch layer formed within the central seam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a semiconductor structure, the method comprising:
   forming a trench structure in a substrate;
   filling the trench structure by conformally deposit a first material in the trench structure;
   treating the first material comprising:
      exposing the first material to a gas mixture comprising a carrier and a seam repairing precursor;
      converting the carrier to a super critical fluid phase; and
      forming a patch layer in a seam of the first material with the seam repairing precursor while the carrier is in the super critical fluid phase; and
   removing a portion of the first material.

2. The method of claim 1, wherein converting the carrier to the super critical fluid phase comprises:
   flowing the gas mixture to a process chamber to a first pressure; and
   heating the gas mixture to a first temperature, wherein the carrier is at a super critical fluid phase under the first temperature and the first pressure.

3. The method of claim 2, wherein the first temperature is above a critical temperature of the carrier and lower than a critical temperature of the seam repairing precursor.

4. The method of claim 3, wherein the seam repairing precursor comprises at least one of $NH_4OH$, $NH_3$, and a silane.

5. The method of claim 3, wherein the seam repairing precursor comprises at least one of a carbon containing compound and $NH_3$.

6. The method of claim 1, wherein the first material comprises one of $Si_3N_4$, SiCN, SiCO, $SiO_2$, Co, Mo, W, TiN, or other materials.

7. The method of claim 1, wherein the carrier is one of carbon dioxide and argon.

8. The method of claim 7, wherein a ratio of the carrier over the seam repairing precursor in the gas mixture is in a range between about 100:1 and about 100000:1.

9. The method of claim 1, further comprising annealing the first material and the patch layer after treating the first material.

10. A method of forming a semiconductor structure, comprising:
    forming a first fin structure and a second fin structure, wherein a trench is formed between the first and second fin structures;
    conformally depositing a first dielectric material to fill the trench, wherein a central seam is formed in the first dielectric material;
    forming a patch layer in the central seam of the first dielectric material, comprising:
       exposing the first dielectric material to a gas mixture comprising a carrier and a seam repairing precursor; and
       converting the carrier to a super critical fluid phase; and
    etching back a portion of the first dielectric material to form a forksheet structure including the first and second fin structure and the first dielectric material; and
    forming epitaxial source/drain regions adjacent the forksheet structure.

11. The method of claim 10, wherein the first dielectric material comprises one of $Si_3N_4$, SiCN, and SiCO.

12. The method of claim 11, wherein the seam repairing precursor comprises at least one of $NH_4OH$, $NH_3$, and a silane.

13. The method of claim 12, wherein the seam repairing precursor further comprises a carbon source.

14. The method of claim 10, wherein the patch layer has a thickness in a range greater than 0 and about 2 nm.

15. The method of claim 10, wherein exposing the first dielectric material to the gas mixture comprises:
    mixing the carrier and the seam repairing precursor at a first ratio; and
    flowing the gas mixture to a process chamber to a first pressure.

16. The method of claim 15, wherein converting the carrier to a super critical fluid phase comprises:
    heating the gas mixture to a first temperature, wherein the carrier is at a super critical fluid phase under the first temperature and the first pressure.

17. A semiconductor device, comprising:
    a first nanostructure;
    a second nanostructure;
    a first source/drain region adjacent the first nanostructure;
    a second source/drain region adjacent the second nanostructure; and
    a dielectric wall between the first nanostructure and the second nanostructure and between the first source/drain region and the second source/drain region, wherein the dielectric wall comprises:
       a first dielectric layer substantially filling a trench between the first and second nanostructures, wherein the first dielectric layer has a central seam; and
       a patch layer formed within the central seam.

18. The semiconductor device of claim 17, wherein the first dielectric layer comprises one of $Si_3N_4$, SiCN, and SiCO.

19. The semiconductor device of claim 18, wherein the patch layer comprises silicon and nitrogen.

20. The semiconductor device of claim 17, wherein the patch layer has a thickness less than about 2 nm.

* * * * *